United States Patent [19]
Anigbogu et al.

[11] Patent Number: 6,021,198
[45] Date of Patent: Feb. 1, 2000

[54] APPARATUS, SYSTEM AND METHOD FOR SECURE, RECOVERABLE, ADAPTABLY COMPRESSED FILE TRANSFER

[75] Inventors: Julian C. Anigbogu; Kim Reniska, both of Austin, Tex.

[73] Assignee: Schlumberger Technology Corporation, Tex.

[21] Appl. No.: 08/772,712

[22] Filed: Dec. 23, 1996

[51] Int. Cl.[7] .................................................. H04L 9/00
[52] U.S. Cl. .................................. 380/9; 380/49; 341/51; 367/60; 704/501
[58] Field of Search ...................... 380/9, 49; 395/600; 704/501; 341/51; 367/21, 60

[56] References Cited

U.S. PATENT DOCUMENTS

| | | |
|---|---|---|
| 4,686,625 | 8/1987 | Bryan . |
| 5,229,768 | 7/1993 | Thomas ..................................... 341/51 |
| 5,235,680 | 8/1993 | Bijnagte . |
| 5,243,341 | 9/1993 | Seroussi et al. ........................... 341/51 |
| 5,646,997 | 7/1997 | Barton ....................................... 380/49 |
| 5,704,060 | 12/1997 | Del Monte ............................... 395/600 |
| 5,884,269 | 3/1999 | Cellier et al. ............................. 704/501 |

OTHER PUBLICATIONS

Poo, G. et al., File recovery by ISO FTAM, Computer Communications, vol. 16, No. 12, Dec. 1993.
PKWARE Press Release PKWARE Ships PKZIP fo Windows, Feb. 16, 1996.

*Primary Examiner*—Salvatore Cangialosi
*Attorney, Agent, or Firm*—Danita J.M. Maseles; Pehr B. Jansson

[57] ABSTRACT

The present invention provides a system for handling and transmitting a file over a communication channel wherein the file may be adaptably compressed to improve throughput. The invention also provides for a method of recovery in the event of a communication failure. The file may be encrypted while it is being transmitted. The compression and transmission may occur while the file is being written, so that the receiving location receives the data in near real time.

78 Claims, 13 Drawing Sheets

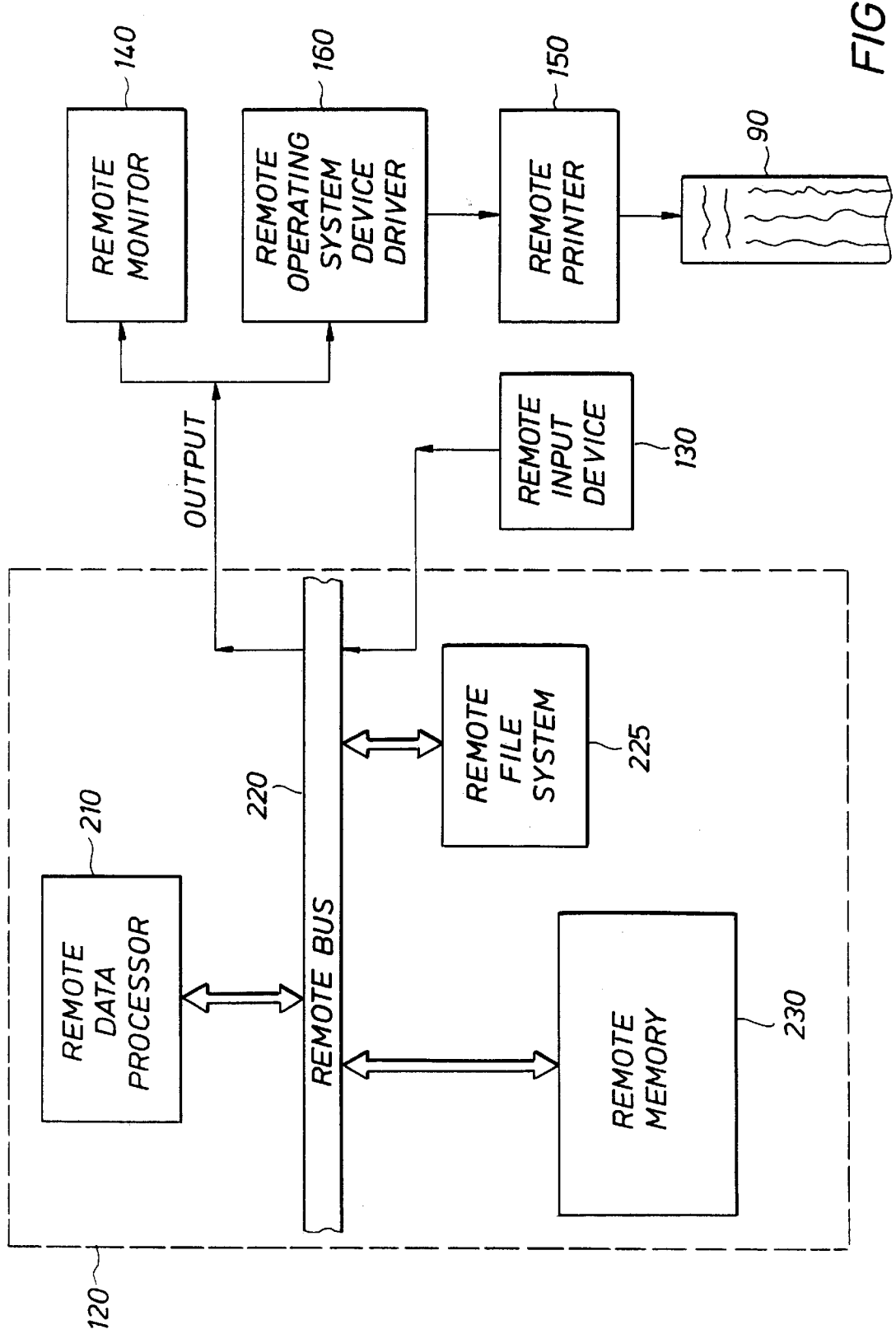

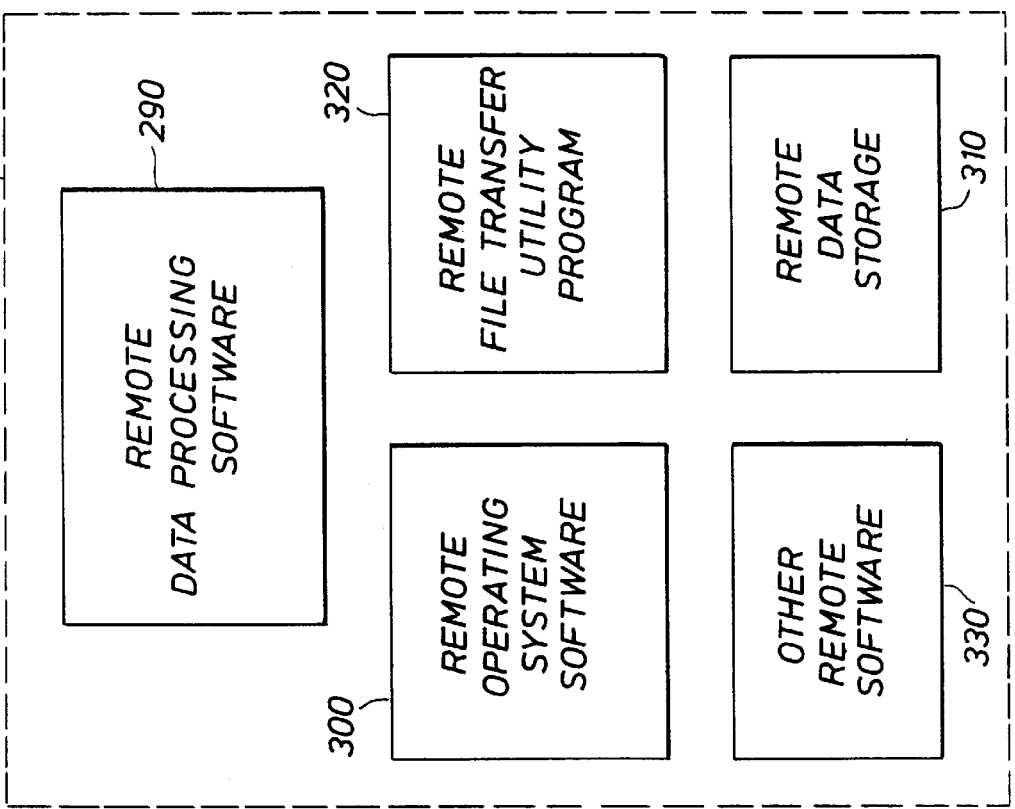
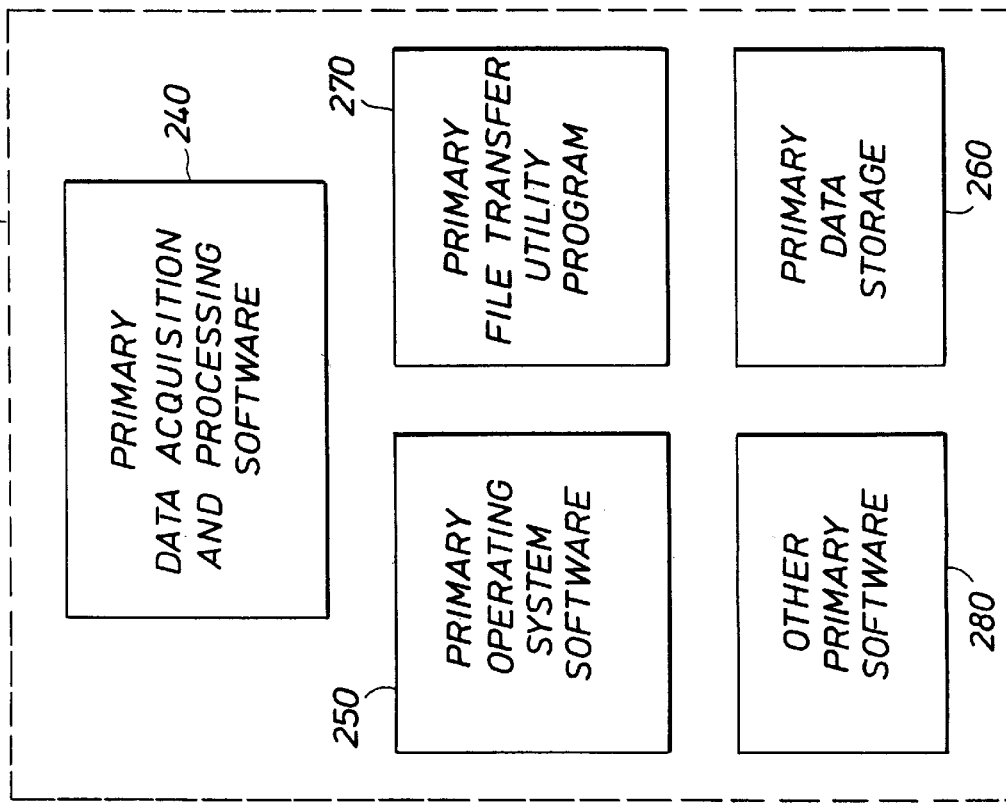

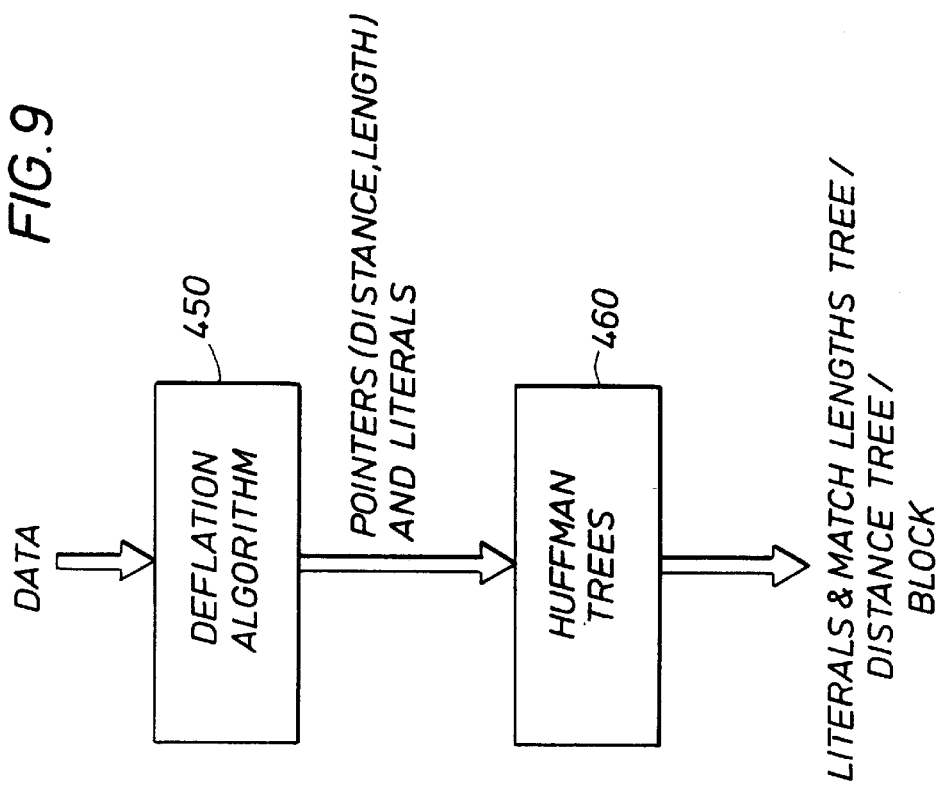
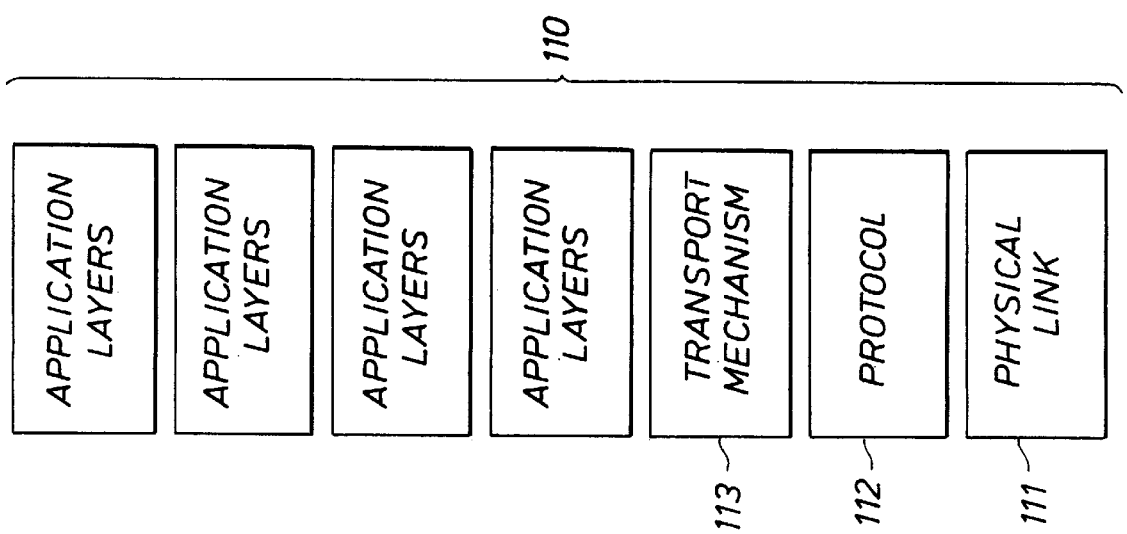

APPARATUS, SYSTEM AND METHOD FOR SECURE, RECOVERABLE, ADAPTABLY COMPRESSED FILE TRANSFER

TECHNICAL FIELD

This invention relates in general to the field of file compression and transfer, and more particularly to an improved apparatus, system and method of achieving secure, recoverable, adaptably compressed file transfers.

BACKGROUND OF THE INVENTION

The ability to move data reliably and securely from one location to another has become an important key to success, and in many cases to survival, for many companies and businesses. In businesses for which the primary product or service delivered is data, this ability is even more critical.

Recent years have seen a proliferation of computers and people connected on a network, in one form or another. Companies have come to depend on the ability to move data on the network to accomplish their tasks and to ensure the continuation of their businesses. A wide variety of connections and speeds are inherent on these networks, ranging from cellular phone modems and dial-up low-speed connections up through ISDN lines, T1 dedicated lines, and high speed ATM connections. A wide variety of different computers with different processing speeds and communications capabilities are attached as nodes on these networks. In many cases, especially in the oil and gas industry, many of the computers are mobile and come and go (attach and detach) from the networks from different locations.

The need to transmit information on these widely varying networks has created a demand for methods, processes, and standard techniques for moving data from one computer system to another in a secure, efficient, and reliable manner. Many of the lower to mid-level protocols have been accepted as standards. Among the most notable of these is the Transport Control Protocol/Internet Protocol (TCP/IP). This is the basic method for moving packets of data on standard networks, including the Internet.

While there have been various applications developed using TCP/IP for transmission, the most widely known is the File Transfer Protocol ("FTP"). FTP was developed to support many different hardware and operating system platforms and is widely used to move data files around networks. It works fairly well in well established, reliable networks but has some limitations on noisy, unreliable, very low bandwidth network connections. Another disadvantage of FTP is that FTP does no compression of data, so all data must be transmitted as is. FTP also provides no recovery mechanism for file transfers. This means that if the connection is lost during a file transmission, the file transfer must be restarted from the beginning. FTP has no inherent security mechanism for protecting the data "on the wire" during the transmission. FTP also requires that the all data to be transmitted is available, i.e. that the complete file is available, before transmission can begin. Yet another disadvantage of FTP is that FTP requires that the file is not being written when the transmission begins or is in progress.

One of the many needs for secure, recoverable, adaptively compressed file transfers may be found in the oil and gas industry. In the oil and gas industry, operating companies which own and/or manage hydrocarbon wells evaluate the wells by wireline logging. In wireline well logging, one or more tools are connected to a power and data transmission cable or "wireline" and are lowered into the well borehole to obtain measurements of geophysical properties for the area surrounding the borehole. The wireline supports the tools as they are lowered into the borehole, supplies power to the tools and provides a communication medium to send signals to the tools and receive data from the tools. Commonly, tools are lowered to a depth of interest in the well and are then retrieved. As the tools are retrieved, they send data about the geological formations through which they pass through the wireline to data acquisition and processing equipment at the surface, usually contained inside a logging truck or a logging unit.

The data acquisition and processing equipment, including software, compiles the data from the tools into a "log," a plot which presents the geophysical information concerning the geological formations encountered by the well, frequently by depth. Logs can also be used to evaluate current production from producing wells or to inspect the integrity of production equipment in a producing well. In any case, the data gathered during the logging operation is generally presented on the log by depth, but may also be presented by time, or any other index by which multiple physical entries are recorded. U.S. Pat. No. 5,051,962 (incorporated by reference) describes such a well logging system controlled by a general purpose computer programmed for real time operation. Various data acquisition and processing software programs are known in the art. An example of data acquisition and processing software is Schlumberger's proprietary MAXIS™ system, which is a suite of separate computer programs.

The data acquisition and processing software writes the log data to two types of locked format files on disk. By "locked," it is meant that the format files cannot be written to and read from at the same time. The two types of locked format files are distinguished by the type of information they contain: one is a data format file and the other is a graphics format file. The data format file contains the numerical properties of the log data; the graphics format file contains the pictorial representation of the data. The data acquisition and processing software continues writing the log data to the locked data format file and the locked graphics format file until the log is complete. Then the data from the locked data format file and the locked graphics format file may be translated from digital readings into physical form by a marking device such as a printer. In addition to the locked data format file and the locked graphics format file, the data acquisition and processing software may send the log data to a viewing monitor, via a renderer. Using the monitor, the well logging professional ("logging engineer") conducting the logging operation can view the log as it is being compiled.

After the log is compiled, it may be transmitted to the operating company's headquarters for interpretation and review by management. The paper log may be sent directly from the wellsite to the operating company as a facsimile. Alternatively, the completed locked data format file may be sent from the wellsite to a data processing center via satellite using a protocol such as DECNET. The data processing center could in turn transmit the log as a facsimile to the operating company. As another alternative, the completed locked data format file may be sent from the wellsite to an operating company using a computer program such as Blast™ by U.S. Robotics.

The data acquired by logging is often crucial to the decision-making process on what will be done with the well being logged. Take, for example, a well which has just been drilled and logged. Depending on the results of the log, the well could be drilled deeper, plugged and abandoned as non-productive or cased and tested—or perhaps the decision will be that additional logs are required before the decision on the disposition of the well can be made. The results of the log may also help determine whether the well requires stimulation or special completion techniques, such as gas lift or sand control. In any case, these decisions are critical and have to be made very quickly. Mistakes or even mere delay can be extremely expensive.

Because log interpretation is part art and part science, the operating company which is drilling or producing the well frequently desires to have its own personnel viewing the log data as the well is being logged. But the operating company may be located half a world away from the well itself. Drilling and production activities are often located in remote locations and it is difficult for the operating company to have its own personnel, such as a geologist or petrophycist, join the wireline company's logging engineer on site during the logging operation. Sometimes logistics or severe weather conditions prevent the operating company from sending anyone to the wellsite for the logging operation. Furthermore, sending personnel to wellsites is expensive and exposes them to all of the hazards of the drilling or production operation, as well as the hazards and inconvenience of travel. As a consequence, tentative decisions often have to be made before the operating company can complete its own review of the actual logging data, relying solely on the interpretations conducted at the wellsite.

Accordingly, a need exists for a system or method which would allow files to be transferred securely, especially while "on the line."

A further need exists for a system or method which would allow a file to be transferred while making maximum use of low bandwidth connections.

A further need exists for a system or method which would allow a file to be transferred while adaptably compressing the file to improve transmission throughput.

A further need exists for a system or method which would overcome the disadvantages of the File Transfer Protocol.

A further need exists for a system or method which would allow files to be transferred taking into account the unique requirements of mobile network connections.

A further a need exists for a system or method which would allow files to be transferred as they are compiled in at least near real time from one location to a remote location remote from the primary for viewing or other use.

A further need exists for a system or method which would allow well data files to be transferred as they are compiled in at least near real time from a wellsite to a remote location remote from the well site for viewing or other use.

A further need exists for a system for or method of file transfer which would provide a recovery method should communications be lost.

Because the data from the logging operation is of a highly competitive nature and is extremely confidential, a need exists for a system or method which will send well data files from a wellsite to a remote location in near real time, in such a way that the data files are not susceptible to being misdirected or lost.

A further need exists for a system or method which can maintain the confidentiality of the well data while it is being transmitted.

A further need exists for a system or method of transferring files in near real time from one location to a remote location so that so that persons can view the files in near real time, without the expense of travelling to the primary location.

A further need exists for a system or method of transferring well data files in near real time from wellsite to a remote location remote from the wellsite so that persons can view the well data files near real time as they are being compiled, without the expense of travelling to the wellsite and without being exposed to the hazards of the wellsite.

SUMMARY OF THE INVENTION

In accordance with the present invention, an apparatus, system and method are provided that substantially eliminate or reduce the disadvantages and problems associated with the previously developed file transfer systems.

The present invention provides a system for handling and transmitting a file over a communication channel which includes a file having a degree of compressibility; a communications channel having a physical bandwidth; a file transfer server at a first location; a file transfer client at a second location and a means for compressing the file based on the physical bandwidth, the capabilities of the transmitting and receiving processors and the degree of compressibility of the file.

The present invention also provides for a system for managing and transmitting a file over a communication channel which includes a file having a degree of compressibility and a plurality of buffers, a communications channel having a physical bandwidth;, a file transfer server at a first location, a file transfer client at a second location, a feedback loop for optimally compressing the file for transmission, including a means for compressing a first buffer to a first level of compressibility; a means for evaluating the efficiency of the compression of the first buffer, a means for adjusting the compression of second buffer based on the evaluation of the compression of the first buffer.

The present invention also provides for a system for managing and transmitting a file over a communication channel which includes a file and a means for compressing buffers of the file in a stream in real time while it is being written.

The present invention also provides for a system for managing and transmitting a file over a communication channel which includes a file, a transmission of the file having a state and a location, and a means for maintaining the state and location of the transmission within the file so that transmission can be resumed in the event of an interruption at the point of the interruption. The interrupted transmission may be automatically resumed or manually resumed.

The present invention also provides for a system for managing and transmitting a file over a communication channel which includes a file, a means for encrypting the file in a stream before and during transmission, and means for de-crypting the file after receipt of transmission.

The present invention also provides for a system for managing and transmitting a file over a communication channel which includes a file having a degree of compressibility and a plurality of buffers, a communications channel having a physical bandwidth, a transmitting processor, a receiving processor, a means for optimally compressing the file based on the physical bandwidth, the capabilities of the transmitting and receiving processors and the degree of compressibility of the file, a means for compressing the buffers of the file in a stream in real time while the file is being written, a transmission of the file having a state and a location, a means for maintaining the state and location of the transmission within the file so that transmission can be resumed in the event of an interruption at the point of the interruption, a means for encrypting the file in a stream before and during transmission; and a means for de-crypting the file after receipt of transmission.

The present invention also provides for a method of compressing a source file, having a plurality of buffers, for transmission over a communication channel, which includes selecting a first buffer of the source file, compressing the first buffer to a first compression level, marshalling the first buffer, transmitting the first buffer, decompressing the first buffer, writing the first buffer to a destination file, determine a first throughput which was used for steps (a) through (f), selecting the compression level of a second buffer based on the first throughput, repeating steps (a) through (h) for each of the buffers in turn until all of the buffers of the source file have been transmittedand have been written to the destination file. The marshalling steps may include encrypting the buffers and the de-compressing steps include de-encrypting the buffers. There may also be a further step of writing to the source file while performing one or more of steps (a) through (i).

The present invention also provides for a system for handling and transmitting a first file over a communication channel which includes a means for reading while writing a first file, a means of compressing the first file, a means of marshalling the first file, a means for transmitting the first file from a first location to a second location, a means for unmarshalling the first file, a means for decompressing the first file, a means for writing the first file to a second file. The means for reading while writing a first file, a means of compressing the first file and means of marshalling the first file may comprise a file transfer server. The means for unmarshalling the first file, a means for decompressing the first file, and a means for writing the first file to a second file may be a file transfer client. The file transfer server may include a read while write module and/or a compression module. The compression module may use a deflation algorithm and or a Huffman tree. The compression module may compress in a first stage to produce literals and pointersand may compress in a second stage to produce a Huffman tree and a block. The invention may also include a means for encrypting the first file before marshalling the first file and a means for decrypting the first file after the first file is transmitted. The file transfer client may include a read while write module. The first file may be a sharable file.

The present invention also provides for a system for handling and transmitting a first file over a communication channel which includes a means for reading while writing data to the first file, a means for compressing the first file, a means for queueing the first file, a means for marshalling the first file, a means for transmitting the first file from a first location to a second location, a first means for unmarshalling the first file, a means for re-queueing the first file, a means for re-marshalling the first file, a remote procedure call for sending the first file within the second location, a second means for unmarshalling the first file, a means for decompressing the first file, a means for writing the first file to a second file. The means for reading while writing data to the first file, for compressing the first file, for queueing the first file, and for marshalling the first filemay be a first file transfer server. The means for a first means for unmarshalling the first file, a means for re-queueing the first file, a means for re-marshalling the first filemay be a file transfer client. The file transfer server may include a read while write module. The file transfer server may include a compression module. The compression module may use a deflation algorithm or a Huffman tree. The compression module may compress in a first stage to produce literals and pointers. The compression module may compress in a second stage to produce a Huffman tree and a block. The present invention may further include a first means for encrypting the first file before marshalling the first file and a first means for decrypting the first file after the first file is transmitted. The present invention may further include a second means for encrypting the first file after the first file is transmitted and a a first means for decrypting the first file after the first file has been sent through the remote procedure call within the second location. The means for a second means for unmarshalling the first file, a means for decompressing the first file, a means for writing the first file to a second file may be a second file transfer server. The file transfer client may include a read while write module. The first file is a sharable file. The second file may be a sharable file.

The present invention also provides for a method for handling and transmitting a first file over a communication channel including the steps of reading while writing data to the first file, compressing the first file, queueing the first file, marshalling the first file, transmitting the first file from a first location to a second location, unmarshalling the first file, decompressing the first file, and writing the first file to a second file. The steps of reading while writing data to the first file, compressing the first file, queueing the first file, marshalling the first file may be accomplished by a file transfer server. The steps of unmarshalling the first file, decompressing the first file, and writing the first file to a second file may be accomplished by a file transfer client. The file transfer server may include a read while write module. The file transfer server may include a compression module. The compression step may include the use of a deflation algorithm for a first stage of compression or a Huffman tree for a second stage of compression. The use of the deflation algorithm in the first stage may produce literals and pointers. The use in a second stage of the Huffman tree may produce a Huffman tree and a block. The present invention may also include the futher include the steps of encrypting the first file before marshalling the first file and decrypting the first file after the first file is transmitted. The file transfer client may include a read while write module. The first file may be a sharable file. The second file may be a sharable file.

The present invention also provides for a method for handling and transmitting a first file over a communication channel including the steps of reading while writing data to the first file, compressing the first file, queueing the first file, marshalling the first file, transmitting the first file from a first location to a second location, unmarshalling the first file, re-queueing the first file, re-marshalling the first file, sending via a remote procedure call the first file within the second location, unmarshalling the first file a second time, decompressing the first file, and writing the first file to a second file. The steps of reading while writing data to the first file, compressing the first file, queueing the first file, marshalling the first file may be accomplished by a first file transfer server. The steps unmarshalling the first file, re-queueing the first file, re-marshalling the first file may be accomplished by a file transfer client. The file transfer server may include a read while write module. The file transfer server includes a compression module. The method for handling and transmitting a first file as in claim 52 wherein the compression step includes use of a deflation algorithm for a first stage of compression. The compression step uses a Huffman tree for a second stage of compression. The use of the Huffman tree produces a Huffman tree and a block. The use of the deflation algorithm in the first stage produces literals and pointers. The present invenrtion may also futher comprise the steps of encrypting the first file before marshalling the first file, decrypting the first file after the first file is transmitted to the second location.

BRIEF DESCRIPTION OF THE DRAWINGS

FIG. 3 illustrates the remote location equipment, including inputs and outputs.

FIG. 4A illustrates the components of the primary memory.

FIG. 4B illustrates the components of the remote memory.

FIG. 8 illustrates the communication system.

FIG. 9 illustrates the compression details.

DESCRIPTION OF A PREFERRED EMBODIMENT

Figure 1:
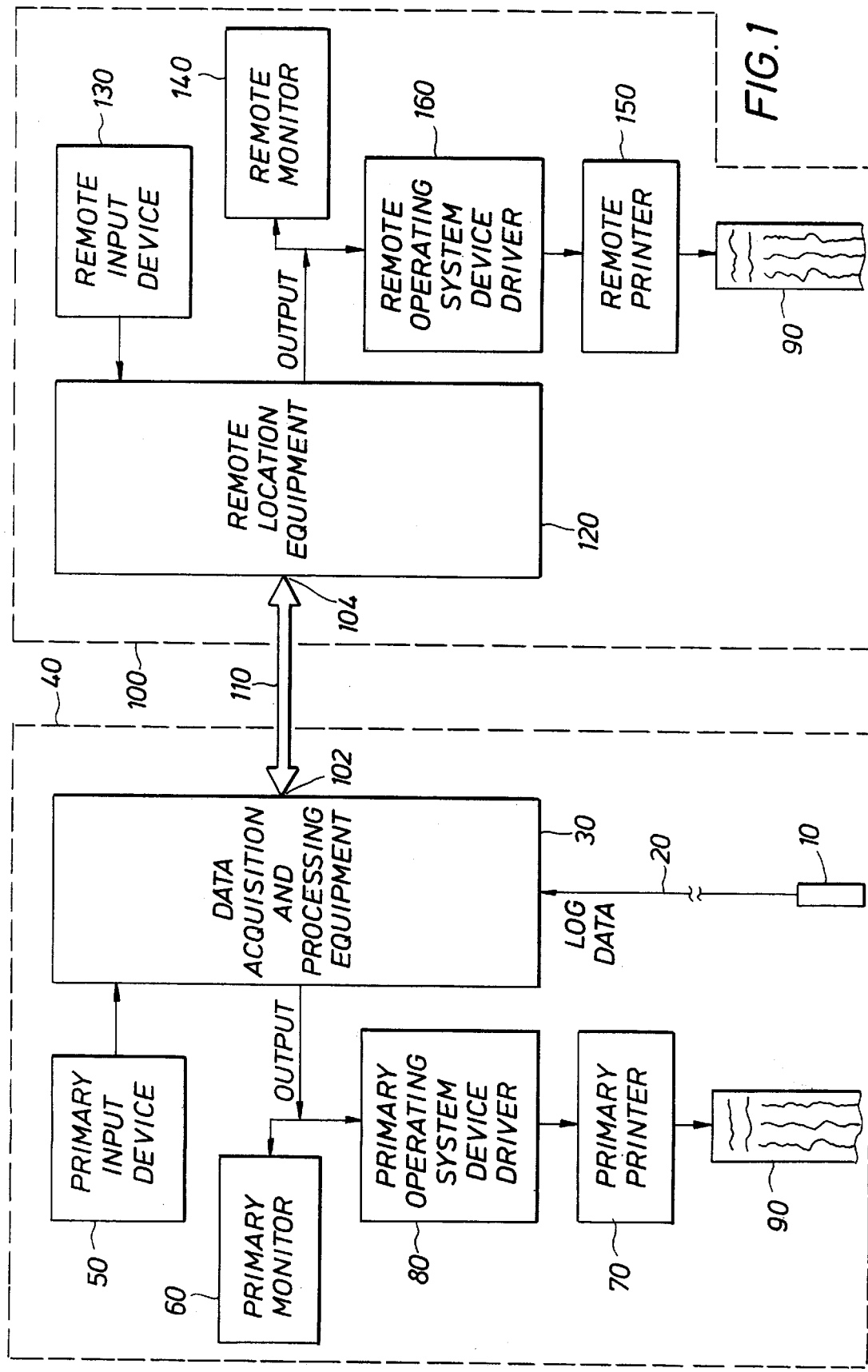
FIG. 1 illustrates a primary location in communication with a remote location according to the present invention.

The above-noted and other aspects of the present invention will become more apparent from a description of a preferred embodiment, when read in conjunction with the accompanying drawings. The drawings illustrate the preferred embodiment of the invention. In the drawings, the same members have the same reference numerals.

I. Overview

As described in co-pending U.S. patent application Ser. No. 08/772,956, incorporated herein by reference and as illustrated in FIG. 1, during logging operations, log data is sent from a logging tool 10 through wireline 20 to a data acquisition and processing system 30 at a wellsite or primary location 40. ("Primary is used in the sense of the word "first," not "most important.") A primary input device 50, such as a keyboard, allows human input into the data acquisition and processing system 30. Outputs to the data acquisition and processing system 30 include a primary monitor 60, and a primary printer 70, which acts through a primary operating system device driver 80 to print a log 90. The data acquisition and processing system 30 communicates with a remote location 100 through a communication channel 110. The remote location 100 has a remote location equipment 120, a remote input device 130 for human input, such as a keyboard, and outputs, such as a remote monitor 140 and a remote printer 150 which acts through a remote operation system device driver 160 to produce a log identical to the log 90 produced at the primary location. (Although the logs have separate physical existences, both logs are given the reference number 90 to indicate this identity.)

Continuing to refer to FIG. 1, the data acquisition and processing equipment 30 and the remote location equipment 120 establish communication over the communication system 110. Preferably, the communication system 110 uses TCP/IP protocol and is based on a physical link, such as hard-wire, cellular, radio, microwave, satellite or telephone transmission. In alternative embodiments, other types of point-to-point network protocols, such as Blast by U.S. Robotics, may be used. In still other embodiments, other types of communication systems could be used. If using the TCP/IP protocol, both the data acquisition and processing equipment 30 and remote location equipment 120 have individual IP addresses 102, 104 in accordance with the TCP/IP protocol. The bandwidth of the communication system 110 is preferably at least 10 kilobits per second. As illustrated in FIG. 8, the components of the communication system 110 include a physical link 111, the protocol 112 such as TCP/IP, and the transport mechanism 113, as well as other components illustrated.

Figure 2:
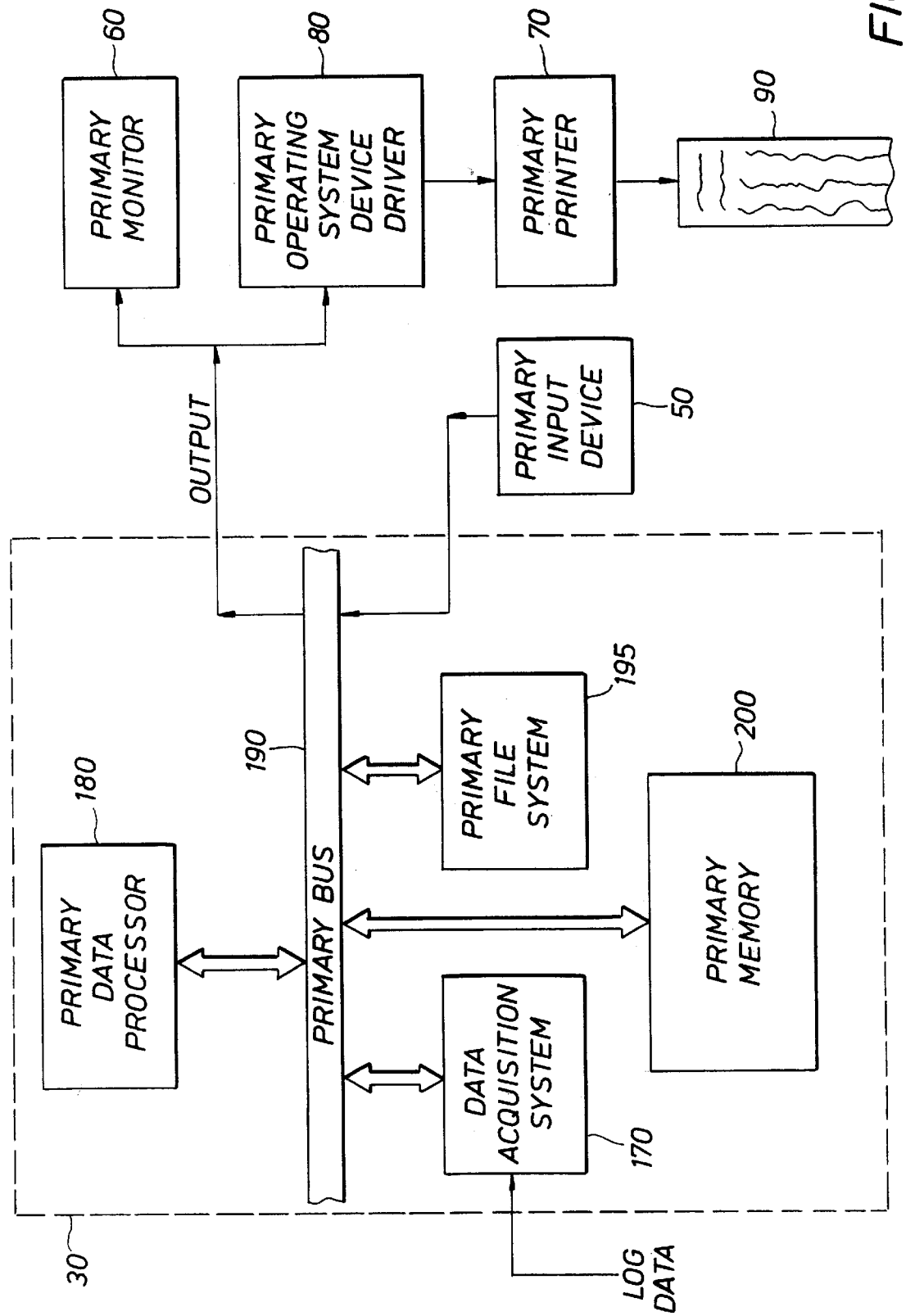
FIG. 2 illustrates the data acquisition and processing equipment of the primary location, including inputs and outputs.

FIG. 2 illustrates the data acquisition and processing equipment present at the primary location 40, including its inputs and outputs. As illustrated in FIG. 2, the log data enters the data acquisition and processing equipment 30 through a data acquisition system 170. The data acquisition and processing equipment 30 also includes a primary data processor 180, a primary bus 190, a primary file system 195, and a primary memory 200. The primary input device 50, the primary monitor 60, the primary printer 70, the primary operating system device driver 80, and the log 90 are also illustrated.

FIG. 3 illustrates the remote location equipment 120, including its inputs and outputs. As illustrated in FIG. 3, the remote location equipment 120 includes a remote data processor 210, a remote bus 220, a remote file system 225, and a remote memory 230. The remote input device 130, the remote monitor 140, the remote printer 150, the remote operating system device driver 160, and the log 90 are also illustrated. The remote data processor 210 is preferably a Pentium PC (P5-90 or higher), with an Ethernet interface or a modem. The remote memory 230 has preferably at least 32 Megabyte RAM.

FIG. 4A illustrates the components of the primary memory 200. As illustrated in FIG. 4A, the primary memory 200 includes a primary data acquisition and processing software 240, a primary operating system software 250, a primary data storage 260, a primary file transfer utility program 270 and other primary software 280. The primary operating system software 250 is preferably Windows® NT™ by Microsoft Corporation. If near real time viewing is not desired, Open VMS or other operating systems may be used.

FIG. 4B illustrates the components of the remote memory. As illustrated in FIG. 4B, the remote memory 230 includes a remote data processing software 290, a remote operating system software 300, a remote data storage 310, a remote file transfer utility program 320 and other remote software 330. The remote operating system software 300 is preferably Windows® NT™ by Microsoft Corporation.

Figure 5A:
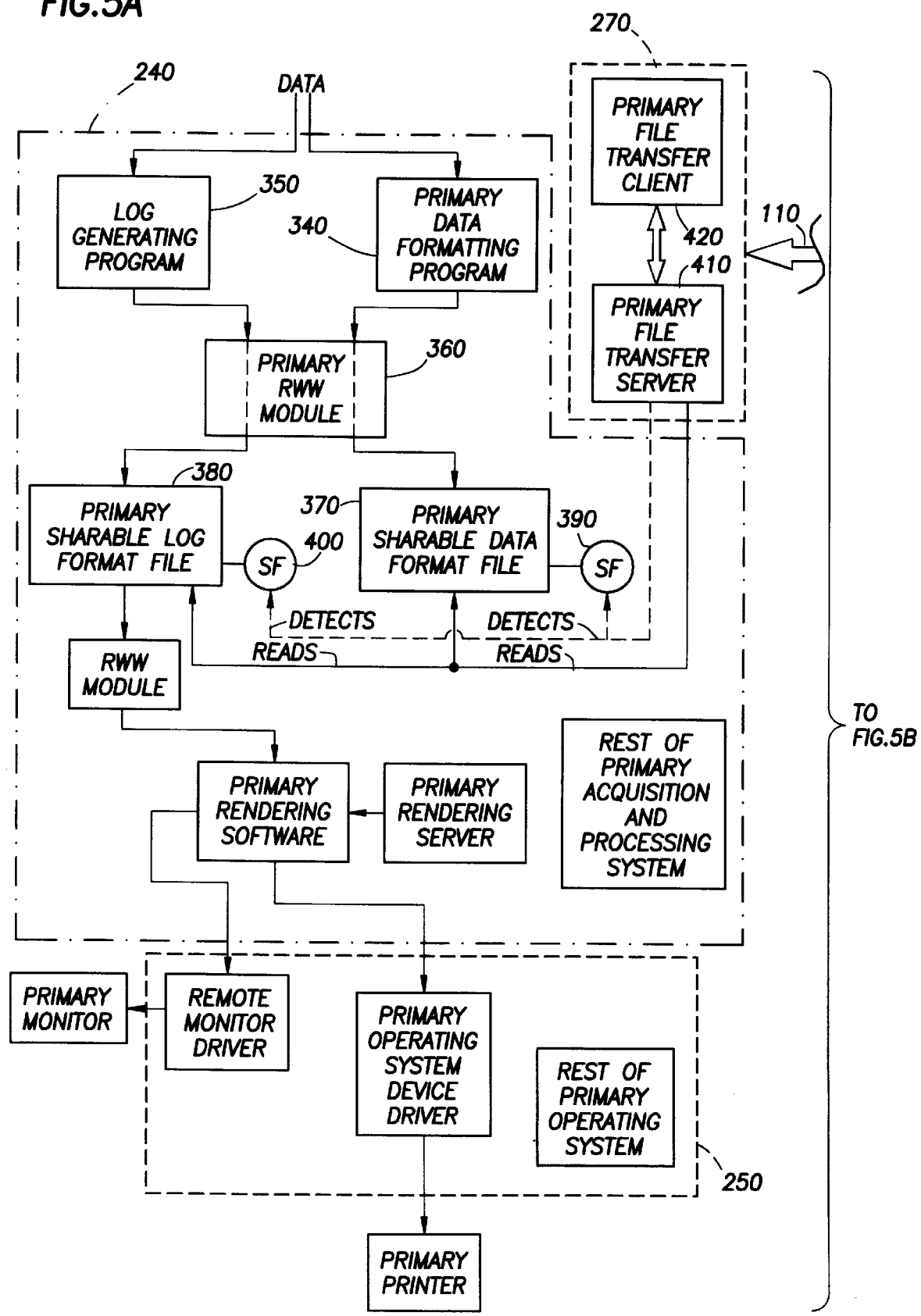
FIG. 5A illustrates the data acquisition and processing software and other software programs at the primary location and the file transfer to the remote location.
Figure 5B:
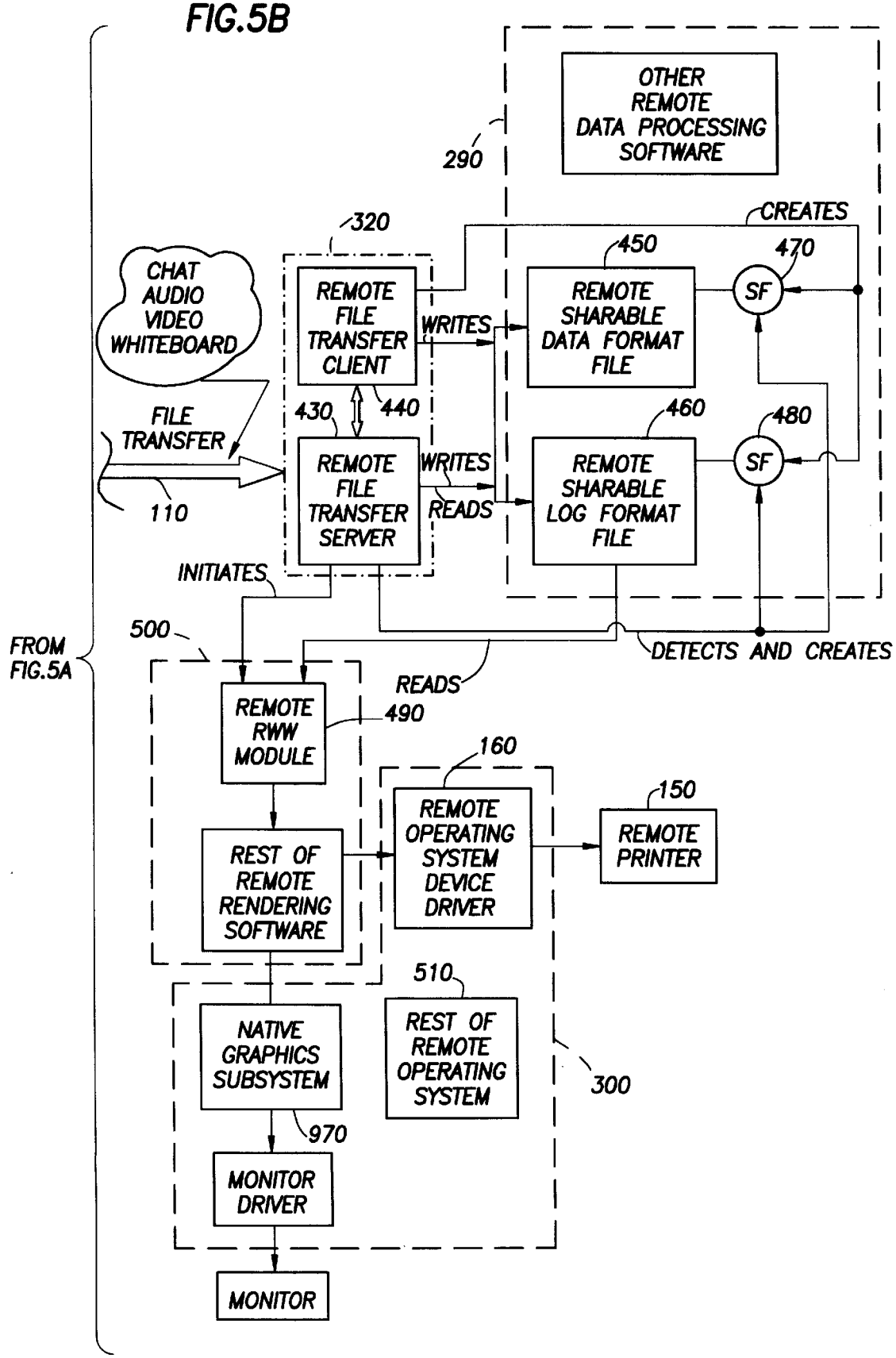
FIG. 5B illustrates the remote data processing software and other software programs at the remote location and the file transfer to the primary location.

FIG. 5A illustrates the data acquisition and processing software 240 and other software programs at the primary location and FIG. 5B illustrates the remote data processing software 290 and other software programs at the remote location. As log data enters the data acquisition and processing software 240, the data enters a primary data formatting program 340 where it is formatted as numerical data in industry standard format for storage. The data also enters a log generating program 350 which adds commands and other instructions to the data to create graphics data. The numerical data includes numerical properties of the data; the graphics data includes pictorial representation of the data.

The data formatting program 340 and the log generating program 350 act through a primary read-while-write ("RWW") module 360 to write the data as it is received to a primary sharable data format file 370 and to one or more primary sharable log graphics files 380, respectively. (Different primary sharable log graphics files 380 may be created for different presentations of the same log data.)

Unlike a locked format file, a sharable format file allows shared file access, such that the sharable format file may be written to and read from at the same time. Preferably, each sharable format file contains all of the acquired data and input parameters for a single logging run, that is, for the data from a set of logging tools run into the well simultaneously.

As the primary RWW module 360 begins to write logging data to the primary sharable data format file 370 and the primary sharable graphics format file 380, the primary RWW module 360 also creates for each of the primary sharable data format file 370 and for the primary sharable graphics format file, 380, a primary semaphore file, 390,400 respectively. The primary semaphore files 390,400 have the same name as the primary sharable format file for which they were created, with the addition of a "_smf" at the end. The existence of a semaphore file indicates that the primary sharable format file with the similar name is a sharable file. Any program which shares access to the sharable format file also uses a copy of the primary RWW module to check for the existence of the associated semaphore file to determine whether the format file is sharable.

Continuing to refer to FIG. 5A, the primary file transfer utility program 270 may include a primary file transfer server 410 (also show in FIG. 5B) and a primary file transfer client 420. As illustrated by FIG. 5B, the remote file transfer utility program 320 may include a remote file transfer server 430 and/or a remote file transfer client 440. The minimum needed is a file transfer server in either the primary or remote location and a file transfer client in the other location. But there may be a file transfer server and a file transfer client in each location.

The primary file transfer server and the remote file transfer server are always on and are always listening for requests from one of the file transfer clients. The file transfer clients are not always on, but are send requests or queries to the file transfer server as initiated by a request from the user through the input device. One file transfer server may handle requests from more than one file transfer client. File transfer clients may or may not read from or write to one of the format files. A file transfer server reads from and writes to a format file. Different scenarios for data requests between file transfer clients and servers are found in FIG. 11A through FIG. 11F.

II. The Read Process

After establishing communication, the remote file transfer client 440 requests data, either numerical data, graphics data or both, from the primary file transfer server 410. Depending on which data it is seeking, the primary file transfer server 410, which contains a copy of the primary RWW module 360, checks for primary semaphore files 390, 400 for both or either of the primary sharable data format file 370 and the primary sharable graphics format file 380. (For example, the primary file transfer server 410, using the primary RWW module 360, would check for primary semaphore file 390 for the primary sharable data format file 370.) After verifying that the primary sharable data format file 370 and/or the primary sharable graphics format file 380 are sharable, the primary file transfer server 410, using its copy of the primary RWW module 360, begins to read the data written the primary sharable data format file 370 and/or the primary sharable graphics format file 380. The primary file transfer server 410 starts at the beginning of the data in the primary sharable data format file 370 and/or the primary sharable graphics format file 380 and continues to read a certain amount of data (as described below) at a time until it reaches a last datum written. Then the primary file transfer server 410 continues to read additional data as it is being written to the primary sharable data format file 370 and/or the primary sharable graphics format file 380 until the logging operation is completed. At that time, the primary sharable data format file 370 and the primary sharable graphics format file 380 are closed by the data acquisition and processing software 240. The data acquisition and processing software 240 also closes and deletes the similarly-named semaphore files 390, 400.

III. Compression and Decompression

The primary file transfer server 410 reads approximately 32,000 bytes (or 32 kilobytes) of data at a time into a buffer, which is then compressed. The compression and decompression functions are performed by a "compression module" and a "decompression module." The compression module and the decompression module use variations of the deflation/inflation algorithms as described in Ziv J., Lempel A., "A Universal Algorithm for Sequential Data Compression", IEEE Transactions on Information Theory, Vol. 23, No. 3, pp. 337–343 (1977) ("LZ77"), incorporated herein by reference.

As described below, compression is accomplished on two stages.

A. Detailed Description of Compression: First Stage

1. The Deflation Algorithm a. Overview

As illustrated in FIG. 9, the compression module uses a deflation algorithm 450 which is a variation of that described in LZ77. The deflation algorithm 450 finds duplicated strings of data in the input data using a fixed-length sliding window. In this description, "string" must be taken as an arbitrary sequence of bytes, and is not restricted to printable (ASCII) characters. Preferably, the string is at least three bytes long. As the fixed length sliding window slides along the data, it looks for re-occurrences of a string of data. The re-occurrence of the string is replaced by a pointer to the previous string. The pointer is expressed as a pair of numbers representing distance and length. Distance means the distance from the beginning of one string and the beginning of its duplicate string. Length is the length of the string. Preferably, distances are limited to 32K bytes, while lengths are limited to 258 bytes. When a string does not occur anywhere in the previous 32K bytes, the string is emitted as a sequence of literal bytes. A sequence of literal bytes is not compressible.

In still greater detail, the deflation algorithm actually finds the duplicate strings using a hash table. As the fixed length sliding window slides over the data, all input strings of at least three bytes in length are inserted into the hash table. An entry into the hash table is called a hash chain. The deflation algorithm computes a hash index, which points to the location of the hash chain, for the next three bytes. If the hash chain for this index is not empty, all strings in the chain are compared with the current input string, and the longest match is selected.

The hash chains are searched starting with the most recent strings, to favor small distances and to take advantage of Huffman encoding, described below. The hash chains are singly linked. There are no deletions from the hash chains; the deflation algorithm simply discards matches that are too old.

To avoid a worst-case situation, very long hash chains are arbitrarily truncated at a certain length, determined by a runtime option. That is, one may select a level of compression, preferably Levels 1 to 9, to determine at what length to truncate the hash chain. Each level will discard hash chains of specific lengths. Because the very long hash chains may be truncated, the compression module does not always find the longest possible match. The compression module generally finds, however, a match which is long enough. Level 0 implements another algorithm (a "stored algorithm") which consists of only writing header information into the output buffer and then copying input to output unchanged, i.e. there is no compression.

b. Lazy Evaluation Method

The compression module may also defer the selection of the matches with a lazy evaluation mechanism. The lazy evaluation mechanism is preferably used for Levels 4 and higher. After a match of length N has been found, the compression searches for a longer match at the next input byte. If a longer match is found, the previous match is truncated to a length of one (thus producing a single literal byte) and the longer match is emitted afterwards. Otherwise, the original match is kept, and the next match search is attempted only N steps later.

The lazy match evaluation is also subject to a runtime parameter. If the current match is long enough, the compression reduces the search for a longer match, thus speeding up the whole process. (See the discussion of improving throughput, below.) If compression ratio is more important than speed, the compression module attempts a complete remote search even if the primary match is already long enough.

c. Alternative to Lazy Evaluation Method

The lazy match evaluation is not performed for the fastest compression modes (Levels 1 to 3). For these fast modes, new strings are inserted in the hash table only when no match is found, or when the match is not too long. This degrades the compression ratio but saves time since there are both fewer insertions and fewer searches.

B. Detailed Description of Compression: Second Stage

Continuing to refer to FIG. 9, a plurality of Huffman trees 460 are used to compress the data to still a further stage. Once this stage has been reached, the data appears as a stream of pointers and literals. In this stage, the compression module looks for repetitions in this stream of pointers and literals. Within the pointers, there may be a match of lengths ("match lengths") or of distances ("match distances"). Literals and match lengths are compressed with a first Huffman tree, and match distances are compressed with a second tree. The compression subroutine deals with a block of the data stream at a time. The trees are stored in a compact form at the start of each block. A block can have any size, except that the compressed data for one block must fit in available memory. The block is terminated when the compression module determines that it would be useful to start another block with fresh trees. (This is somewhat similar to "Compress" and "Zip" programs by Unix.)

The compression module was designed to allow single pass compression without any backwards seek, and without a prior knowledge of the uncompressed input size or the available size on the output media. If the compression method is 0 (stored) however, the stored data comes after the "crc" and "compressed size." This enables fast "decompression."

Compression is always performed, even if the compressed data is slightly larger than the original. This may occur when the data within 32 kilobytes is not compressible or if the compression module has been set to Level 0 to turn off the compression. The worst case expansion is a few bytes for the compression module buffer header, plus 5 bytes every 32K block, or an expansion ratio of 0.015% for large data. The actual number of used disk blocks almost never increases.

C. Decompression

Information needed for the decompression is inserted at the head of the compressed data. The decompression module simply reverses the Huffman tree compression, which results in a sequence of literal bytes and pointers. The decompression module replicates the strings pointed to by the distance/length pointers.

IV. Improving Throughput: Adaptable Compression

Figure 10:
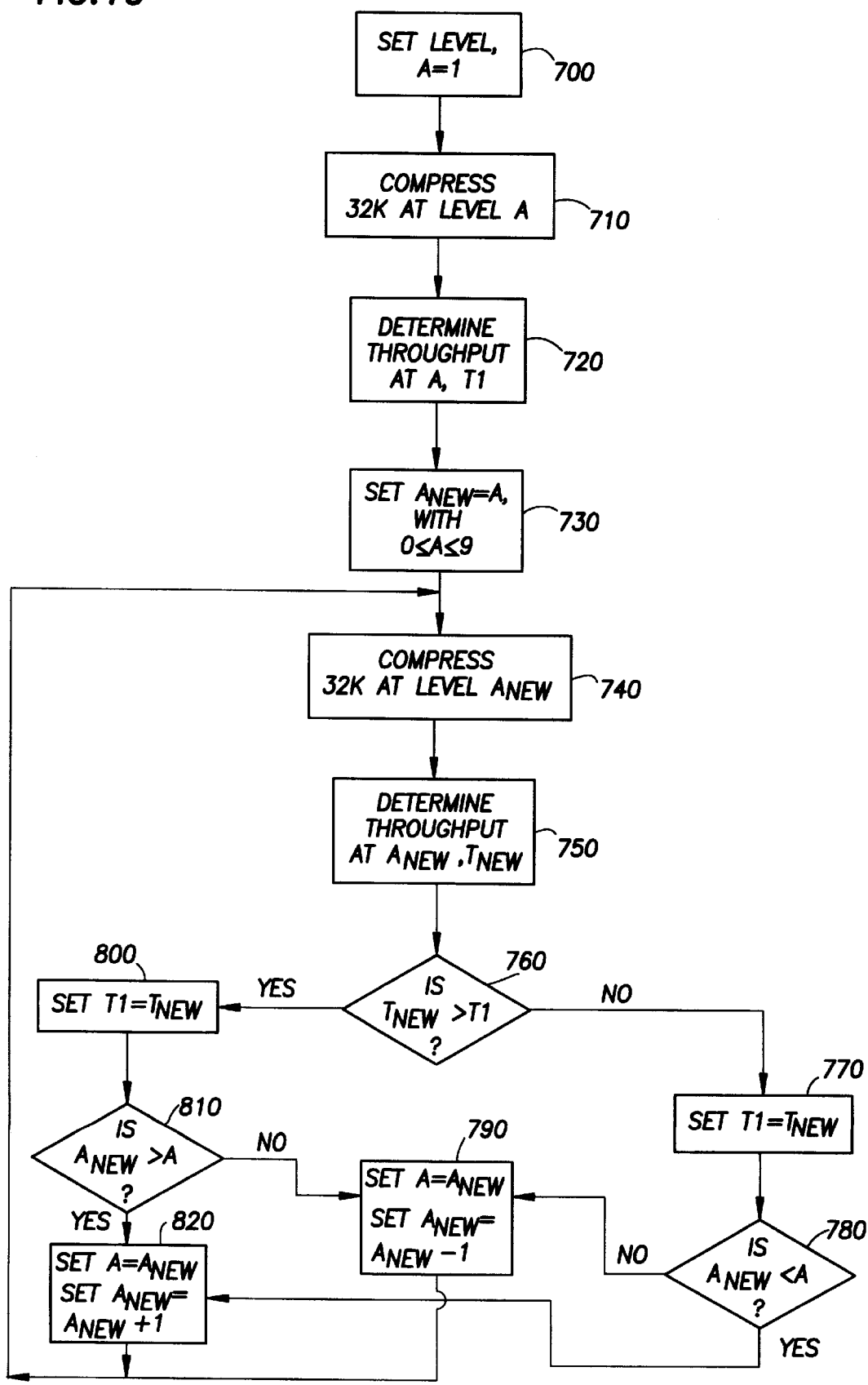
FIG. 10 illustrates adaptable compression.
Figure 11A:
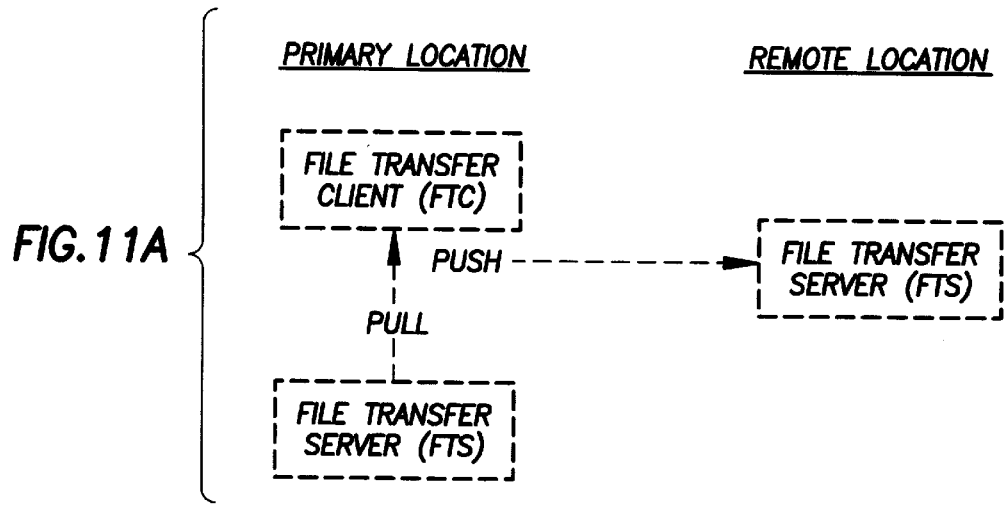
FIGS. 11A–11F illustrate different scenarios for file transfer.
Figure 11B:
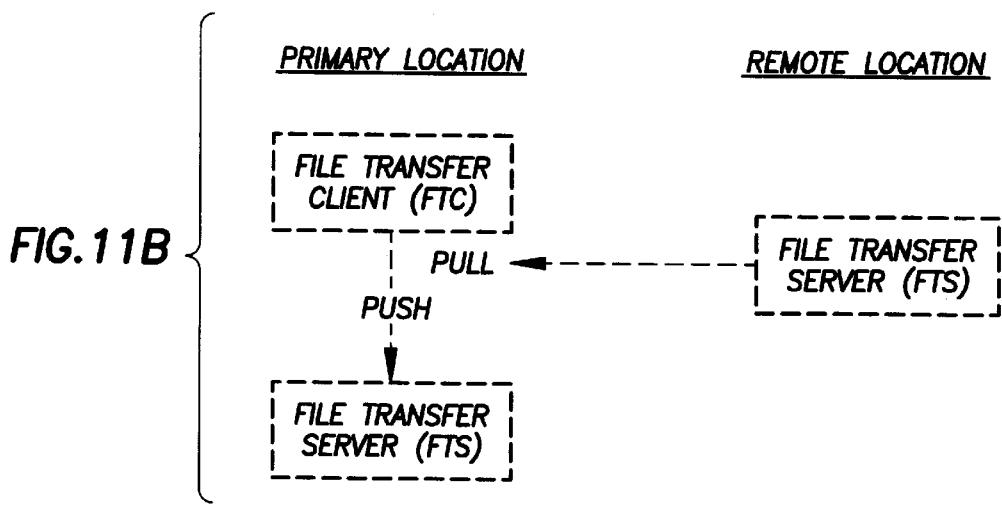
Figure 11C:
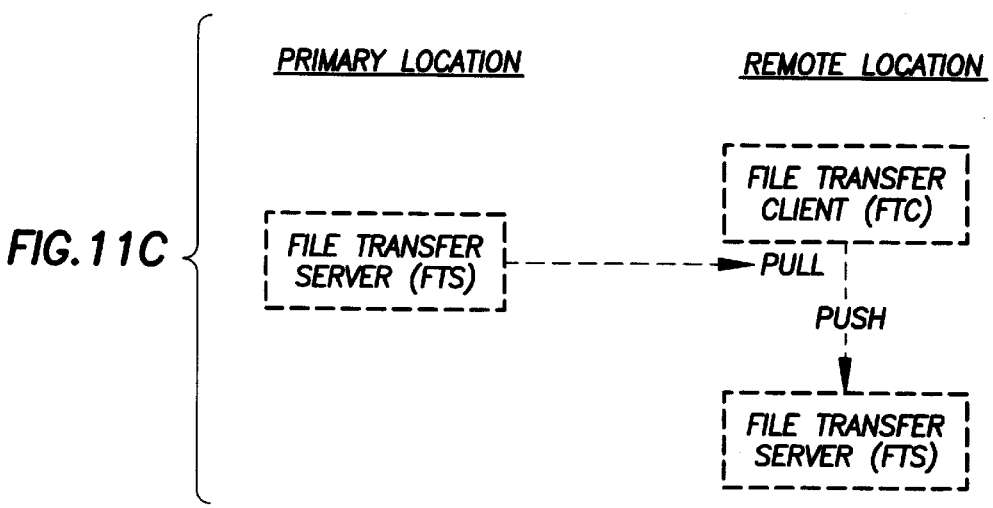
Figure 11D:
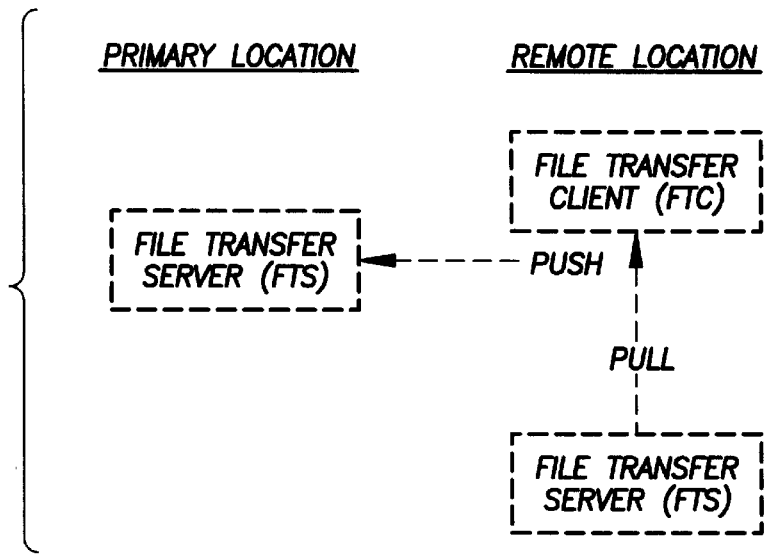
Figure 11E:
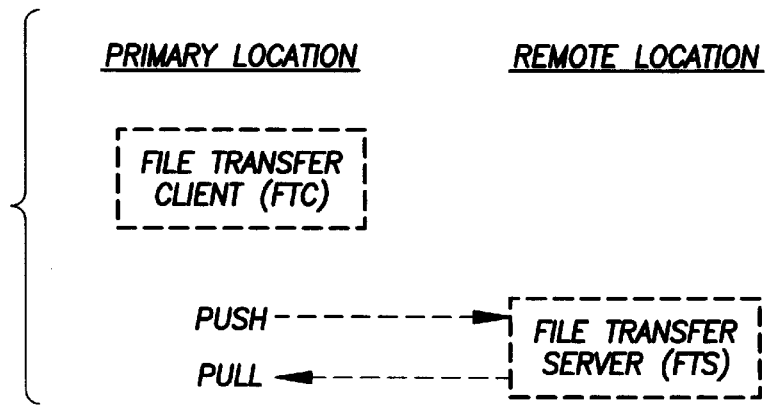
Figure 11F:
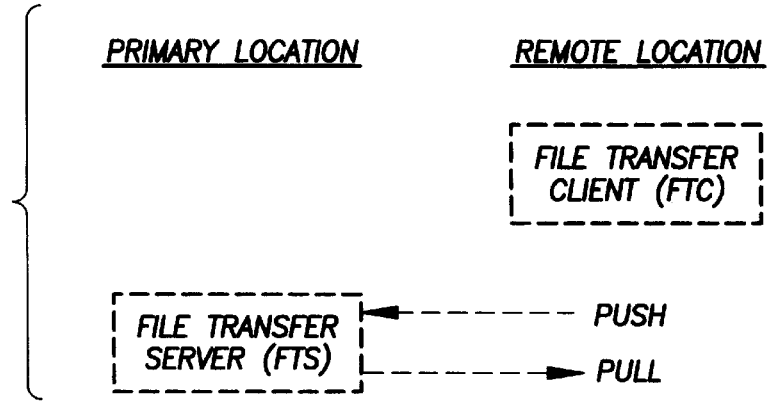

FIG. 10 illustrates the process of adaptive file compression.

Several factors can affect the throughput of a file transfer. These factors include varying bandwidth or delay, CPU availability on the sending or receiving processors, and compressibility of the data. The compression is accomplished in such a way as to optimize the average throughput of the file transfer by modifying compression levels for varying conditions.

The variables involved in total transmission time and their relationships is shown by the formula:

$$T=C+M+X+D \qquad \text{EQ. 1}$$

where T is the total time required to transmit a buffer of data, C is the time required to the compression module the data, M is the marshalling time, that is the time required to reorder the data to transmission byte order and to encrypt if desired, X is the time required to transmit the data and D is the time required to decompress the data.

The variables of M and D are small compared to C and X. C and D are both proportional to the amount of data transmitted, but C is much larger than D. X is proportional to the amount of data transmitted and is inversely proportional to the bandwidth of the communication channel. The delay and pipeline size of the communication channels are also significant factors.

For instance, a satellite bandwidth may be 256 kilobytes per second and its delay 1.25 seconds per round trip. When the data is sent and an acknowledgment is received, that is one round trip. The amount of data which may be sent through the pipe at one time ("pipeline size") may be about 28 kilobytes. When the DCE software is installed, the pipeline size should be set to 28 kilobytes.

For very large data files which may consist of hundreds or thousands of buffers, it is advantageous to attempt to minimize T. The time to compress, C, can be reduced by using a lower level of compression, but this also results in more data to be transmitted, which in turn increases X. The relationship between C and X can be stated as:

$$X=A/C$$

where A is a data dependent factor and depends on the bandwidth and the compression level. Assuming that M and D are negligible, the formula for total time becomes:

$$T=C+A/C$$

Attempting the optimal compression level to minimize T would be very difficult and the time required to determine that value would also increase T. Since the compressibility of the data and the available CPU cycles at both ends if the transmission are also major factors, it is not practicable to determine the optimal compression level for each buffer.

However, one can vary the compression level and see whether the throughput improves or degrades. If throughput improves, one can change the compression level in the same direction as the previous time. If throughput degrades, one can change the compression level in the opposite direction.

For example, if a change in the compression level from 4 to 5 improves throughput, then one can increase the compression level still further to 6. If the compression level of 6 then decreases throughput, the compression level can be set back to 5 for the next attempt.

Continual variation of the compression level is unlikely to achieve optimized throughput for any single transmission. However, continual variation of the compression level is likely to yield a better average throughput for a wide range of files over varying conditions than are achieved with a fixed compression level.

Referring to FIG. 10, the Level is set 700 to A, preferably a number between 0 and 9.32 kilobytes of data are compressed 710 at Level A. Throughput T1 is calculated 720 for Level A. Level $A_{new}$ is set 730 to A. The next 32 kilobytes are compressed 740 at Level $A_{new}$ and the throughput, $T_{new}$, is determined 750. $T_{new}$ is compared to T1 760.

If $T_{new}$ is greater than T1, then T1 is set 800 to $T_{new}$ and $A_{new}$ is compared 810 to A. If $A_{new}$ is greater than A, A is set equal $A_{new}$ and $A_{new}$ is set equal to $A_{new}+1$ 820. If $A_{new}$ is not greater than A, A is set equal to $A_{new}$ and $A_{new}$ is set equal to $A_{new}-1$. The steps repeat beginning at step 740.

If $T_{new}$ is not greater than T1, then T1 is set 770 to $T_{new}$ and $A_{new}$ is compared 780 to A. If $A_{new}$ is less than A, A is set equal $A_{new}$ and $A_{new}$ is set equal to $A_{new}+1$ 820. If $A_{new}$ is not less than A, A is set equal to $A_{new}$ and $A_{new}$ is set equal to $A_{new}-1$. The steps repeat beginning at step 740.

V. Encryption, Marshalling and Transmission

Figure 6:
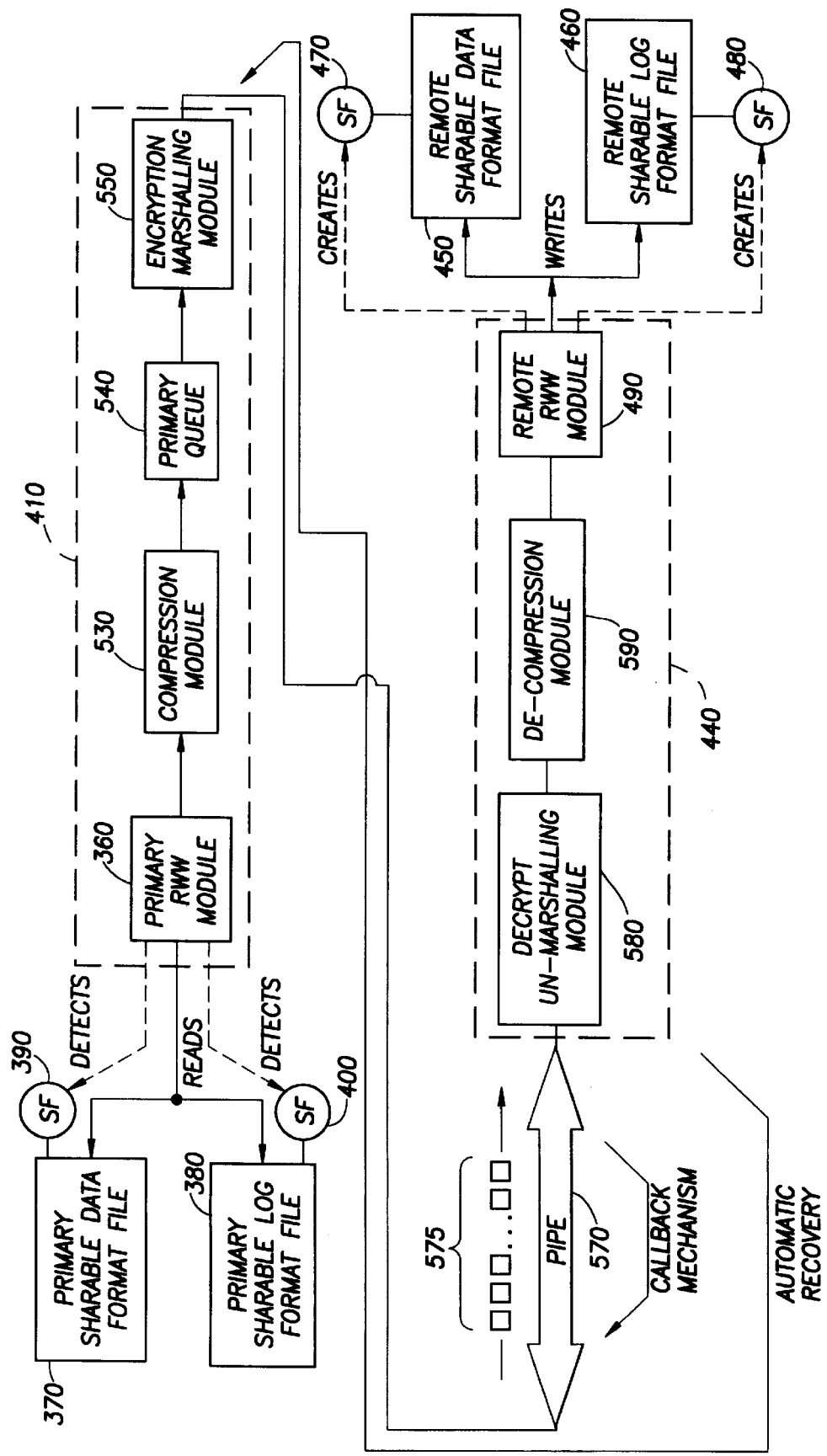
FIG. 6 illustrates the transmission process if near real time display is not desired.
Figure 7A:
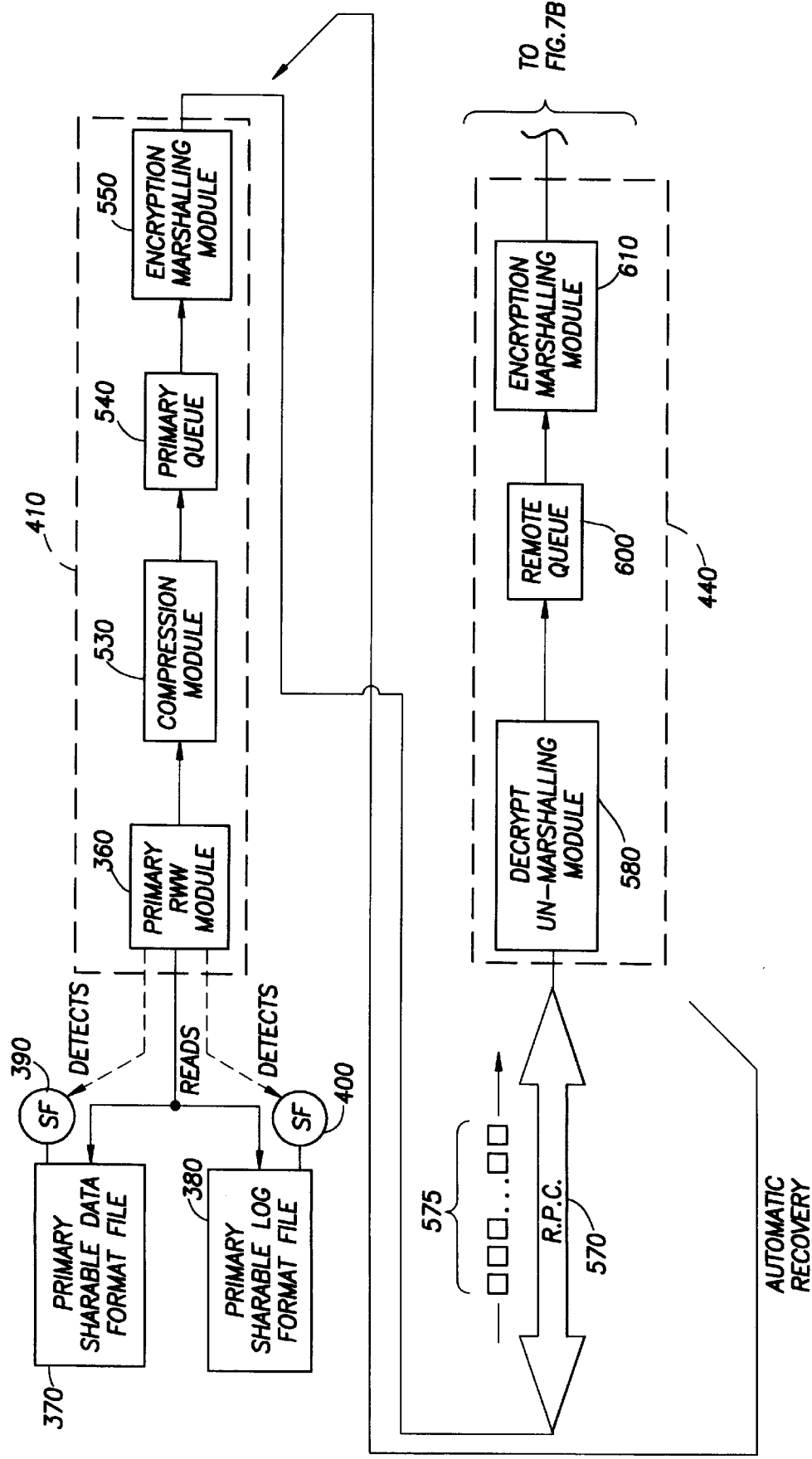
FIG. 7A and FIG. 7B illustrate the transmission process if near real time display is desired.
Figure 7B:
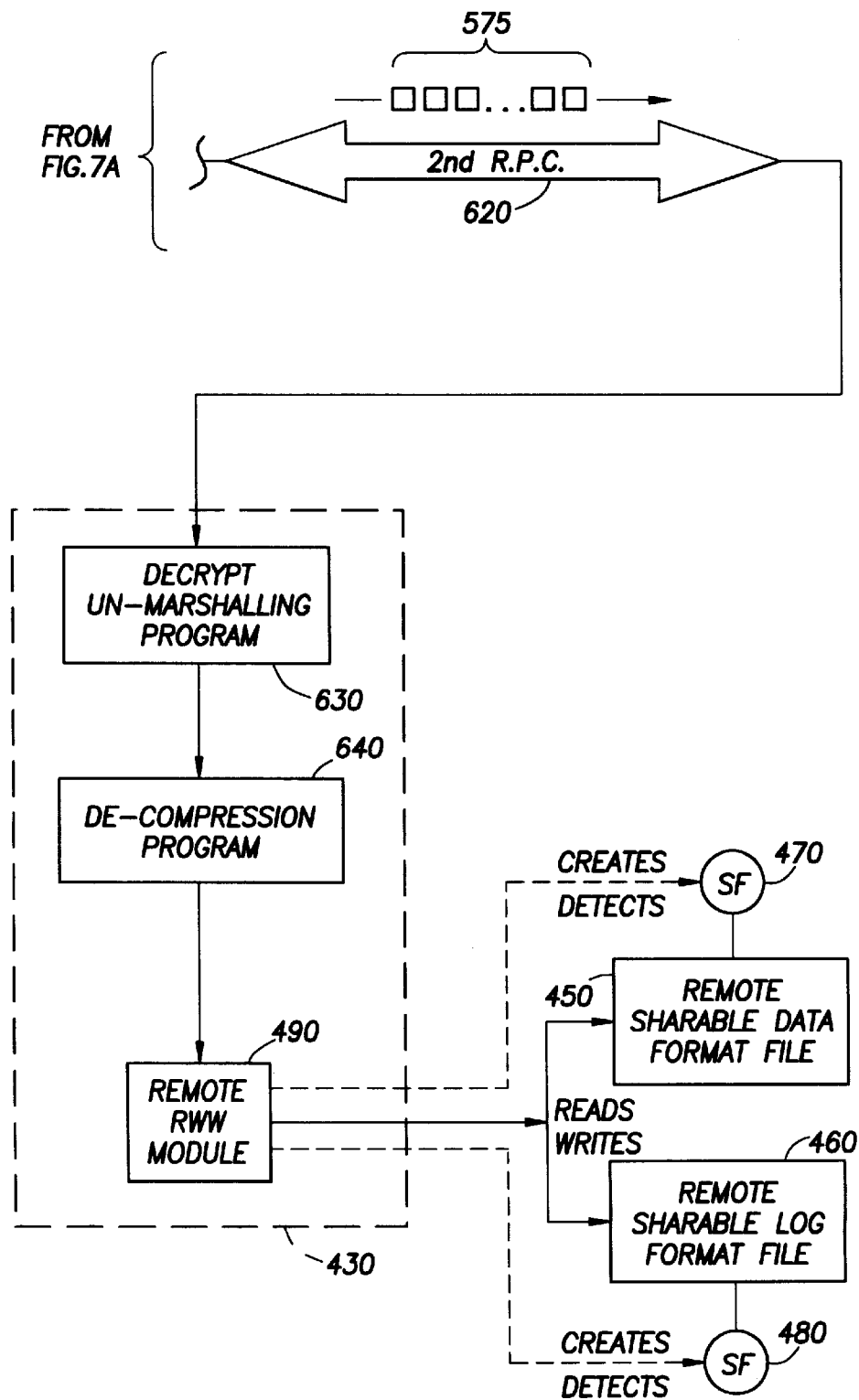

Referring to FIG. 6 and, FIG. 7A, and FIG. 7B, the compressed buffer is put into a queue 540. The compressed buffer may be encrypted, if desired, and marshalled by an encryption and marshalling module 550 such as Distributed Computing Environment ("DCE") by Open Group. Operating systems often order data either "big endian" or "little endian" (high order byte or low order byte). For example, VMS and Windows NT use little endian; UNIX uses big endian. Marshalling means ordering the data into a platform independent byte order, so that it can be properly received and understood without regard to how the operating system organized it. After marshalling, the buffer is transmitted to the remote file transfer client 440 via a remote procedure call 570, such as a DCE pipe. The pipe 570 includes a callback mechanism which provides for a continuous read-send loop. That is to say that the primary file transfer server 410 can send a first buffer via the remote procedure call 140 and then read a second buffer of data and send it too, without waiting for the remote file transfer client 440 to receive the first buffer and request another. Other remote procedure calls in alternative embodiments of the invention do not include the callback mechanism.

If there should be an interruption during transmission of the file, the system attempts an automatic recovery. The remote file transfer client 440 will use an automatic callback system three times to attempt to re-establish communications. If communication is successfully re-established, the transfer of data will resume where it left off. This is accomplished by the remote file transfer client 440 knowing how many bytes of data it has and telling the primary file transfer server 410 to pick up at the next byte. If the remote file transfer client 440 has 1000 bytes of data, it will tell the primary file transfer server 410 to begin transmitting at byte number 1001. If the attempts are unsuccessful, i.e. the communications failure is complete, the transfer can be re-started manually, in recover mode, to resume from the point of interruption.

VI. At Remote Location

At the remote location, the transmitted data is de-crypted, unmarshalled, decompressed and written to disk. This may be accomplished in many ways as detailed in the next section, but is preferably accomplished in one of two ways, depending on whether the data is to be viewed in near real time.

A. Without Near Real Time Viewing

If it is not desired to view the data in near real time, it is preferable to allow the remote file transfer client 440 to write data directly to the sharable data and log format files, instead of using the remote file transfer server to do so. In fact, in such a situation, a remote file transfer server is not required. In addition, in such a case, the remote procedure call preferred is a DCE pipe.

As illustrated in FIG. 6, in such a case, the transmitted data is received by the remote file transfer client 440, de-crypted and unmarshalled using a de-cryption/unmarshalling module 580. The remote file transfer client 440 then decompresses the transmitted data with the decompression module 590 and uses its own copy of the RWW module 490 to write the data to the sharable remote data format file 450 and/or the sharable remote log format file 460 and create the semaphore files, 470, 480. After the data storage is completed, the data may be rendered into a log and printed or viewed on the remote monitor.

B. With Near Real Time Viewing

If the data is to be viewed in near real time, it is preferable to allow the remote file transfer server to launch the remote renderer and remote monitor. In such a case, it is preferable that the remote file transfer server, and not the remote file transfer client, handle writing the data to the sharable data and log format files. In addition, in such a case, the remote procedure call need not be the DCE pipe, because in real time, the data is accumulating more slowly and may be be transmitted at a slower rate.

As described in co-pending U.S. patent application Ser. No. 08/772,956 and as illustrated in FIG. 7A and FIG. 7B, the the transmitted data is received by the remote file transfer client 440, de-crypted and unmarshalled using a de-cryption/un-marshalling module 580. The data is then put into a remote queue 600. Then the remote file transfer client encrypts, if desired, and marshalls the data using an encrytption and marshalling module 610 and uses a second remote procedure call 620 to send the data to the remote file transfer server. The remote file transfer server decrypts and un-marshalls the data using a decryption/un-marshalling module and decompresses it using a decompression module 640. Then using its own copy of the RWW module 490, the remote file transfer server writes the data to writes the data to the sharable remote data format file and/or the sharable remote log format file, and creates the related semaphore files 470, 480.

As described in greater detail in co-pending U.S. patent application Ser. No. 08/772,956, if it is desired to view the data as it is being written, the remote renderer can use its own copy of the RWW module 490 to read the data from the sharable log format file as it is being written and sends the data, through drivers, to the remote printer or remote monitor. This allows a person at the remote location to view or to print the data while it is being written to the remote sharable graphics data format 66.

The invention described in co-pending U.S. patent application Ser. No. 08/772,956 also provides a method of person-to-person communication at the same time the log transmission is occurring.

The present invention can be used to transfer any type of file data and is especially useful in transmitting data as it is being acquired.

One benefit of the present invention is that it allows files to be transferred securely, especially while "on the line."

Another benefit of the present invention is that it allows files to be transferred while making maximum use of low bandwidth connections.

Another benefit of the present invention is that it allows a file to be transferred while adaptably compressing the file to improve transmission throughput.

Another benefit of the present invention is that it overcomes the disadvantages of the File Transfer Protocol.

Another benefit of the present invention is that it allows files to be transferred taking into account the unique requirements of mobile network connections.

Another benefit of the present invention is that it allows a file to be transferred as it is compiled in at least near real time from one location to a remote location remote from the primary for viewing or other use.

Another benefit of the present invention is that it allows a well data file to be transferred as it is compiled in at least near real time from a wellsite to a remote location remote from the well site for viewing or other use.

Another benefit of the present invention is that it provides a recovery method should communications be lost.

Another benefit of the present invention is that it sends well data files from a wellsite to a remote location in near real time, in such a way that the data files are not susceptible to being misdirected or lost.

Another benefit of the present invention is that it can maintain the confidentiality of the well data while it is being transmitted.

Another benefit of the present invention is that it allows transferring files in near real time from one location to a remote location so that so that persons can view the files in near real time, without the expense of travelling to the primary location.

Another benefit of the present invention is that it allows transferring well data files in near real time from wellsite to a remote location remote from the wellsite so that persons can view the well data files near real time as they are being compiled, without the expense of travelling to the wellsite and without being exposed to the hazards of the wellsite.

The principles, preferred embodiments, and modes of operation of the present invention have been described in the foregoing specification. The invention is not to be construed as limited to the particular forms disclosed, because these are regarded as illustrative rather than restrictive. Moreover, variations and changes may be made by those skilled in the art without departing from the spirit of the invention.

What is claimed is:

1. A system for managing and transmitting a file having a degree of compressibility and a plurality of buffers over a communication channel having a physical bandwidth comprising:

a) a file transfer server at a first location operable to transmit a file;

b) a file transfer client at a second location operable to receive a file; and c) a feedback loop for compressing the file for transmission, including:

1.) means for compressing a first buffer to a first level of compressibility;

2.) means for evaluating the throughput of the first buffer when the first buffer is transmitted from the first location to the second location;

3.) means for setting the compression level of a second buffer based on the throughput of the first buffer and the first level of compressibility.

2. The system for managing and transmitting a file over a communication channel of claim 1, the feedback loop further comprises 4.) means for evaluating the throughput of a zeroth buffer; and wherein the means for setting the compression level of a second buffer further based upon the throughput of the zeroth buffer and the compression level of the zeroth buffer.

3. The system for managing and transmitting a file over a communication channel of claim 1, further comprising:

in the event of an interruption in the transmission of the file, transmitting from the transfer client to the transfer server the number of data items received, and resuming transmission by the transfer server with the data item following the number of data items received.

4. A system for managing and transmitting a file having a degree of compressibility and a plurality of buffers over a communication channel having a physical bandwidth comprising:

a) a file transfer server at a first location;

b) a file transfer client at a second location;

c) a throughput measuring mechanism at the first location which measures throughput for each transmitted block of data; and d) an adaptive compressor at the first location, wherein the adaptive compressor accepts as an input the throughput from previously transmitted data blocks.

5. The system for managing and transmitting a file of claim 4, wherein the adaptive compressor adjusts a compression level in response to the input throughput from previously transmitted data blocks.

6. The system for managing and transmitting a file of claim 5, wherein the previously transmitted data blocks is a sequence of data blocks and the adaptive compressor adjusts the compression level in response to the two most recently transmitted data blocks.

7. The system for managing and transmitting a file of claim 6, wherein the adaptive compressor adjusts the compression level by applying a rule selected from the set including:

increases the compression level if the throughput of the most recently transmitted block is better than the throughput of the block before the most recently transmitted block and the compression level of the most recently transmitted block is greater than the compression level of the block before the most recently transmitted block, increases the compression level if the throughput of the most recently transmitted block is worse than the throughput of the block before the most recently transmitted block and the compression level of the most recently transmitted block is worse than the compression level of the block before the most recently transmitted block, decreases the compression level if the throughput of the most recently transmitted block is better than the throughput of the block before the most recently transmitted block and the compression level of the most recently transmitted block is less than the compression level of the block before the most recently transmitted block, and decreases the compression level if the throughput of the most recently transmitted block is worse than the throughput of the block before the most recently transmitted block and the compression level of the most recently transmitted block is greater than the compression level of the block before the most recently transmitted block.

8. A system for managing and transmitting a file having a degree of compressibility and a plurality of buffers over a communication channel comprising:

a.) a communications channel having a physical bandwidth;

b.) a transmitting processor;

c.) a receiving processor;

d.) a means to determine transmission throughput;

e.) a means for compressing the file by compressing a first buffer to a first degree of compressibility, compressing a second buffer to a second degree of compressibility, transmitting the first and second buffers and determining a relative throughput, based on the relative throughput, compressing a third buffer to a third degree of compressibilty;

f.) a means for compressing the buffers of the file in a stream in real time while the file is being written;

g.) a means for transmission of the file;

h.) a means for maintaining a received location of the transmission within the file;

i.) a means, responsive to an transmission interruption and subsequent resumption of transmission, for communicating the location of the data last received prior to the transmission interruption;

j.) a means for encrypting the file in a stream before and during transmission; and k.) a means for decrypting the file after receipt of transmission.

9. A method of compressing a source file, having a plurality of buffers, for transmission over a communication channel, comprising:

a.) selecting a first buffer of the source file;

b.) compressing the first buffer to a first compression level;

c.) marshalling the first buffer onto the communication channel;

d.) transmitting the first buffer;

e.) de-compressing the first buffer;

f.) writing the first buffer to a destination file;

g.) determine a first throughput which was achieved for steps (a) through (f);

h.) selecting a second compression level of a second buffer based on the first throughput wherein there is a difference between the first and second compression levels indicating a direction of change in compression level; and i.) repeating steps (a) through (h) for each of the buffers in turn until all of the buffers of the source file have been transmitted__and have been written to the destination file.

10. A method as in claim 9, wherein the selecting the compression level of a second buffer step includes determining if the first throughput is an improvement over the throughput of a previous buffer and if the first throughput is an improvement selecting a second compression level that is further in the direction of change in compression level, otherwise selecting a second compression level that is opposite the direction of change in compression level.

11. A method as in claim 10, further comprising the step of writing to the source file while performing one or more of steps (a) through (i).

12. A system for handling and transmitting a first file having a sequential plurality of buffers where each buffer is either the first buffer, the second buffer, the last buffer or a buffer that has a previous and a next buffer, over a communication channel comprising:

a.) a means for reading while writing data to the first file;

b.) a means for compressing each buffer of the first file at one of multiple levels of compression;

c.) a means for queueing the first file;

d.) a means for marshalling the first file;

e.) a means for sequentially transmitting the buffers that constitute the first file from a first location to a second location and for each transmitted buffer determining the throughput achieved;

f.) a means for unmarshalling the first file;

g.) a means for decompressing the first file; and h.) a means for writing the first file to a second file;

wherein the means for compressing b) for each buffer that is not the first buffer nor the second buffer, selects a compression level based on the throughput achieved in the transmission of the two preceding buffers.

13. A system for handling and transmitting a first file as in claim 12 wherein the means for accomplishing steps a through d comprises a file transfer server.

14. A system for handling and transmitting a first file as in claim 12 wherein the means for accomplishing steps f through g comprises a file transfer client.

15. A system for handling and transmitting a first file as in claim 13 wherein the file transfer server includes a read while write module.

16. A system for handling and transmitting a first file as in claim 13 wherein the file transfer server includes a compression module.

17. A system for handling and transmitting a first file as in claim 16 wherein the compression module uses a deflation algorithm.

18. A system for handling and transmitting a first file as in claim 16 wherein the compression module uses a Huffman tree.

19. A system for handling and transmitting a first file as in claim 16 wherein the compression module compresses in a first stage to produce literals and pointers.

20. A system for handling and transmitting a first file as in claim 19 wherein the compression module compresses in a second stage to produce a Huffman tree and a block.

21. A system for handling and transmitting a first file as in claim 12, futher comprising a means for encrypting the first file before marshalling the first file and a means for decrypting the first file after the first file is transmitted.

22. A system for handling and transmitting a first file as in claim 14 wherein the file transfer client includes a read while write module.

23. A system for handling and transmitting a first file as in claims 12 and 21, wherein the first file is a sharable file.

24. A system for handling and transmitting a first file having a sequential plurality of buffers where each buffer is either the first buffer, the second buffer, the last buffer or a buffer that has a previous and a next buffer, over a communication channel comprising:

a.) a means for reading while writing data to the first file;

b.) a means for compressing each buffer of the first file at one of multiple levels of compression;

c.) a means for queueing the first file;

d.) a means for marshalling the first file;

e.) a means for sequentially transmitting the buffers that constitute the first file from a first location to a second location and for each transmitted buffer determining the throughput achieved;

f.) a first means for unmarshalling the first file;

g.) a means for re-queueing the first file;

h.) a means for re-marshalling the first file;

i.) a remote procedure call for sending the first file within the second location;

j.) a second means for unmarshalling the first file;

k.) a means for decompressing the first file; and l.) a means for writing the first file to a second file;

wherein the means for compressing b) for each buffer that is not the first buffer nor the second buffer, selects a compression level based on the throughput achieved in the transmission of the two preceding buffers.

25. A system for handling and transmitting a first file as in claim 24 wherein the means for accomplishing steps a through d comprises a first file transfer server.

26. A system for handling and transmitting a first file as in claim 24 wherein the means for accomplishing steps f through g comprises a file transfer client.

27. A system for handling and transmitting a first file as in claim 25 wherein the file transfer server includes a read while write module.

28. A system for handling and transmitting a first file as in claim 25 wherein the file transfer server includes a compression module.

29. A system for handling and transmitting a first file as in claim 28 wherein the compression module uses a deflation algorithm.

30. A system for handling and transmitting a first file as in claim 28 wherein the compression module uses a Huffman tree.

31. A system for handling and transmitting a first file as in claim 28 wherein the compression module compresses in a first stage to produce literals and pointers.

32. A system for handling and transmitting a first file as in claim 31 wherein the compression module compresses in a second stage to produce a Huffman tree and a block.

33. A system for handling and transmitting a first file as in claim 24, futher comprising:

a first means for encrypting the first file before marshalling the first file;

a first means for decrypting the first file after the first file is transmitted.

34. A system for handling and transmitting a first file as in claim 33, futher comprising a second means for encrypting the first file after the first file is transmitted;

a first means for decrypting the first file after the first file has been sent through the remote procedure call within the second location.

35. A system for handling and transmitting a first file as in claim 24 wherein the means for accomplishing steps j through l comprises a second file transfer server.

36. A system for handling and transmitting a first file as in claim 14 wherein the file transfer client includes a read while write module.

37. A system for handling and transmitting a first file as in claims 24, 26 and 35, wherein the first file is a sharable file.

38. A method for handling and transmitting a first file consisting of a sequence of buffers over a communication channel comprising the steps of:

a.) reading while writing data to the first file;

b.) compressing each buffer of the first file at one of multiple levels of compression;

c.) queueing the first file;

d.) marshalling the first file;

e.) sequentially transmitting the buffers of the first file from a first location to a second location while determining the throughput achieved for each transmitted buffer;

f.) unmarshalling the first file;

g.) decompressing the first file; and h.) writing the first file to a second file;

wherein the step of compressing b) comprises selecting a compression level based on the achieved throughput of previously transmitted buffers.

39. A method for handling and transmitting a first file as in claim 38 wherein steps a through d are accomplished by a file transfer server.

40. A method for handling and transmitting a first file as in claim 38 wherein steps f through g are accomplished by a file transfer client.

41. A method for handling and transmitting a first file as in claim 39 wherein the file transfer server includes a read while write module.

42. A method for handling and transmitting a first file as in claim 38 wherein the file transfer server includes a compression module.

43. A method for handling and transmitting a first file as in claim 38 wherein the compression step includes use of a deflation algorithm for a first stage of compression.

44. A method for handling and transmitting a first file as in claim 38 wherein the compression step uses a Huffman tree for a second stage of compression.

45. A method for handling and transmitting a first file as in claim 43 wherein the use of the deflation algorithm in the first stage produces literals and pointers.

46. A method for handling and transmitting a first file as in claim 44 wherein the use in a second stage of the Huffman tree produces a Huffman tree and a block.

47. A method for handling and transmitting a first file as in claim 38, futher comprising the steps of:

encrypting the first file before marshalling the first file; and decrypting the first file after the first file is transmitted.

48. A system for handling and transmitting a first file as in claim 40 wherein the file transfer client includes a read while write module.

49. A system for handling and transmitting a first file as in claim 38, wherein the first file is a sharable file.

50. A system for handling and transmitting a first file as in claim 38, wherein the second file is a sharable file.

51. A method for handling and transmitting a first file consisting of a sequence of buffers over a communication channel comprising the steps of:

a.) reading while writing data to the first file;

b.) compressing each buffer of the first file at one of multiple levels of compression;

c.) queueing the first file;

d.) marshalling the first file;

e.) sequentially transmitting the buffers of the first file from a first location to a second location while determining the throughput achieved for each transmitted buffer;

f.) unmarshalling the first file;

g.) re-queueing the first file;

h.) re-marshalling the first file;

i.) sending via a remote procedure call the first file within the second location;

j.) unmarshalling the first file a second time;

k.) decompressing the first file; and l.) writing the first file to a second file;

wherein the step of compressing b) comprises selecting a compression level based on the achieved throughput of previously transmitted buffers.

52. A method for handling and transmitting a first file as in claim 51 wherein the steps a through d are accomplished by a first file transfer server.

53. A method for handling and transmitting a first file as in claim 51, wherein steps f through g are accomplished by a file transfer client.

54. A method for handling and transmitting a first file as in claim 52 wherein the file transfer server includes a read while write module.

55. A method for handling and transmitting a first file as in claim 52 wherein the file transfer server includes a compression module.

56. A method for handling and transmitting a first file as in claim 52 wherein the compression step includes use of a deflation algorithm for a first stage of compression.

57. A method for handling and transmitting a first file as in claim 56 wherein the compression step uses a Huffman tree for a second stage of compression.

58. A method for handling and transmitting a first file as in claim 57 wherein the use of the Huffman tree produces a Huffman tree and a block.

59. A system for handling and transmitting a first file as in claim 56 wherein the use of the deflation algorithm in the first stage produces literals and pointers.

60. A method for handling and transmitting a first file as in claim 51, futher comprising the steps of:

encrypting the first file before marshalling the first file;

decrypting the first file after the first file is transmitted to the second location.

61. A method for handling and transmitting a first file as in claim 60, futher comprising encrypting the first file a second time, after the first file is transmitted;

decrypting the first file after the first file has been sent through the remote procedure call within the second location.

62. A method for handling and transmitting a first file as in claim 51, wherein steps j through l are accomplished using a second file transfer server.

63. A method for handling and transmitting a first file as in claim 53, wherein the file transfer client includes a read while write module.

64. A method for handling and transmitting a first file as in claims 51 and 61, wherein the first file is a sharable file.

65. A system for acquiring and transmitting well log data, comprising:

a) a log data acquisition and processing software module operable to receive well log data;

b) a primary file transfer utility program connected to the log data acquisition and processing software module and having a compression module, wherein the file transfer server comprises:

i) a means for periodically adjusting the compression level based on a most recently used compression level and a throughput obtained using the most recently used compression level; and c) a remote file transfer utility program connected to the primary file transfer utility program.

66. The system for acquiring and transmitting well log data of claim 65 wherein the log data acquisition and processing software comprises:

a means for storing a log graphics file connected to the primary file transfer utility program.

67. The system for acquiring and transmitting well log data of claim 66 wherein the log data acquisition and processing software comprises:

a semaphore file connected to the log graphics file for indicating when the log graphics file may be read from or written to.

68. The system for acquiring and transmitting well log data of claim 67 wherein the log data acquisition and processing software comprises:

a read-while-write module connected to the log graphics file for receiving log graphics from a log generating program and operable to write the log graphics onto the log graphics file while the log graphics is being read by another module.

69. The system for acquiring and transmitting well log data of claim 65 wherein the log data acquisition and processing software comprises:

a means for storing a log data file connected to the primary file transfer utility program.

70. The system for acquiring and transmitting well log data of claim 69 wherein the log data acquisition and processing software comprises:

a semaphore file connected to the log data file for indicating when the log data file may be read from or written to.

71. The system for acquiring and transmitting well log data of claim 70 wherein the log data acquisition and processing software further comprises:

a read-while-write module connected to the log data file for receiving log data from a log generating program and operable to write the log data onto the log data file while the log data is being read by another module.

72. A method of transmitting a file over a communications channel from a first location to a second location, comprising:

a) compressing a first buffer of the file to a first compression level;

b) transmitting the first buffer from the first location to the second location;

c) compressing a second buffer of the file to a second compression level;

d) transmitting the second buffer from the first location to the second location;

e) evaluating the relative throughput of the first and second buffers from the first location to the second location;

f) setting a third compression level as a function of the throughput of the first and second buffers;

g) compressing a third buffer to the third compression level; and h) transmitting the third buffer from the first location to the second location.

73. The method of transmitting a file according to the method of claim 72, further comprising:
   i) evaluating the relative efficiency of the transmission of the second and third buffers;
   j) setting a fourth compression level as a function of the relative throughput of the second and third buffers;
   k) compressing a fourth buffer to the fourth compression level; and
   l) transmitting the fourth buffer from the first location to the second location.

74. The method of transmitting a file according to the method of claim 72, wherein the step f) comprises:
   if the throughput of the first buffer is better than the throughput of the second buffer, setting the third compression level to be in the direction of the compression level of the first buffer.

75. The method of transmitting a file according to the method of claim 74, wherein the step f) comprises:
   if the compression level of the first buffer, A, is less than the compression level of the second buffer, Anew, set the compression level for the third buffer to be Anew minus 1; and
   if the compression level of the first buffer, A, is not less than the compression level of the second buffer, Anew, set the compression lever for the third buffer to be Anew plus 1.

76. The method of transmitting a file according to the method of claim 72, wherein the step f) comprises:
   if the throughput of the second buffer is better than the throughput of the first buffer, setting the third compression level to be in the direction away from the compression level of the first buffer.

77. The method of transmitting a file according to the method of claim 76, wherein the step f) comprises:
   if the compression level of the first buffer, A, is less than the compression level of the second buffer, $A_{new}$, set the compression level for the third buffer to be $A_{new}$ plus 1; and
   if the compression level of the first buffer, A, is not less than the compression level of the second buffer, set the compression level for the third buffer to be $A_{new}$ minus 1.

78. A method of transmitting a file composed of multiple buffers, comprising:
   a) transmitting a sequence of buffers having a first buffer, wherein, except for the first buffer, for each buffer there is a preceding buffer;
   b) prior to transmitting a buffer, adjusting the compression level with respect to the compression level used for the previous buffer;
   c) for each buffer determining its throughput;
   d) if the throughput improves with the compression level adjustment, adjusting the compression level in step b) in the same direction as used for the preceding buffer and if the throughput degrades with the compression level adjustment, adjusting the compression level in step b) in the opposite direction as used for the preceding buffer.

* * * * *